(12) United States Patent
Lee et al.

(10) Patent No.: US 12,243,934 B2
(45) Date of Patent: Mar. 4, 2025

(54) CHANNEL STRUCTURES INCLUDING DOPED 2D MATERIALS FOR SEMICONDUCTOR DEVICES

(71) Applicant: Taiwan Semiconductor Manufacturing Company, Ltd., Hsinchu (TW)

(72) Inventors: Ching-Hua Lee, Hsinchu (TW); Miao-Syuan Fan, Hsinchu (TW); Ta-Hsiang Kung, New Taipei (TW); Jung-Wei Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/452,581

(22) Filed: Aug. 21, 2023

(65) Prior Publication Data

US 2023/0402534 A1   Dec. 14, 2023

Related U.S. Application Data

(62) Division of application No. 17/400,076, filed on Aug. 11, 2021, now Pat. No. 12,100,755.

(Continued)

(51) Int. Cl.
| | |
|---|---|
| *H01L 21/00* | (2006.01) |
| *H01L 21/02* | (2006.01) |
| *H01L 29/06* | (2006.01) |
| *H01L 29/16* | (2006.01) |
| *H01L 29/24* | (2006.01) |
| *H01L 29/423* | (2006.01) |
| *H01L 29/66* | (2006.01) |

(Continued)

(52) U.S. Cl.
CPC .... *H01L 29/7606* (2013.01); *H01L 21/02568* (2013.01); *H01L 21/0259* (2013.01); *H01L 29/0665* (2013.01); *H01L 29/0673* (2013.01); *H01L 29/1606* (2013.01); *H01L 29/24* (2013.01); *H01L 29/42392* (2013.01); *H01L 29/66969* (2013.01); *H01L 29/78696* (2013.01)

(58) Field of Classification Search
CPC ........... H01L 29/42392; H01L 29/0673; H01L 29/1606; H01L 29/24; H01L 29/66969; H01L 29/78696; H01L 29/1033; H01L 21/02568; H01L 21/02538; H01L 21/02664; H01L 21/425
See application file for complete search history.

(56) References Cited

U.S. PATENT DOCUMENTS

| | | |
|---|---|---|
| 10,388,732 B1 | 8/2019 | Frougier et al. |
| 2017/0003248 A1* | 1/2017 | Yang ........................ H01L 29/24 |

(Continued)

*Primary Examiner* — Reema Patel
(74) *Attorney, Agent, or Firm* — Kilpatrick Townsend & Stockton LLP

(57) ABSTRACT

A semiconductor device includes a substrate, a semiconductor structure suspending over the substrate and comprising a source region, a drain region, and a channel region disposed between the source region and the drain region. The channel region includes a doped two-dimensional (2D) material layer comprising a first portion on an upper surface of the channel region. The semiconductor device also includes an interfacial layer surrounding the channel region including the first portion of the doped 2D material layer, and a gate electrode surrounding the interfacial layer.

20 Claims, 34 Drawing Sheets

Related U.S. Application Data

(60) Provisional application No. 63/173,297, filed on Apr. 9, 2021.

(51) Int. Cl.
*H01L 29/76* (2006.01)
*H01L 29/786* (2006.01)

(56) References Cited

U.S. PATENT DOCUMENTS

2020/0343273 A1 10/2020 Huang
2021/0408288 A1 12/2021 O'Brien et al.

* cited by examiner

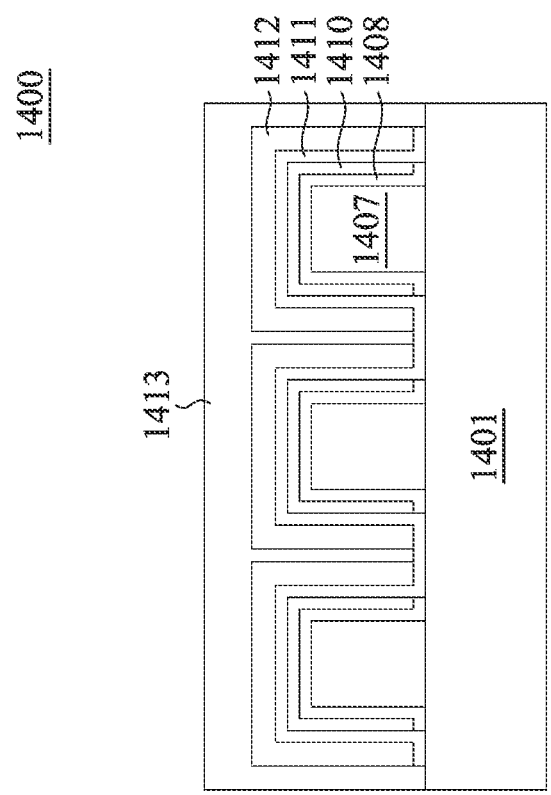
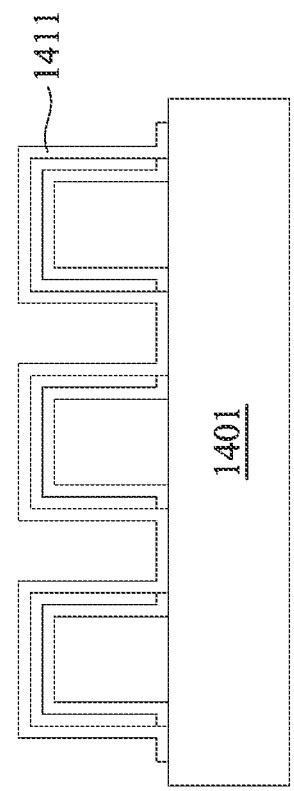
Fig. 14F
Fig. 14E

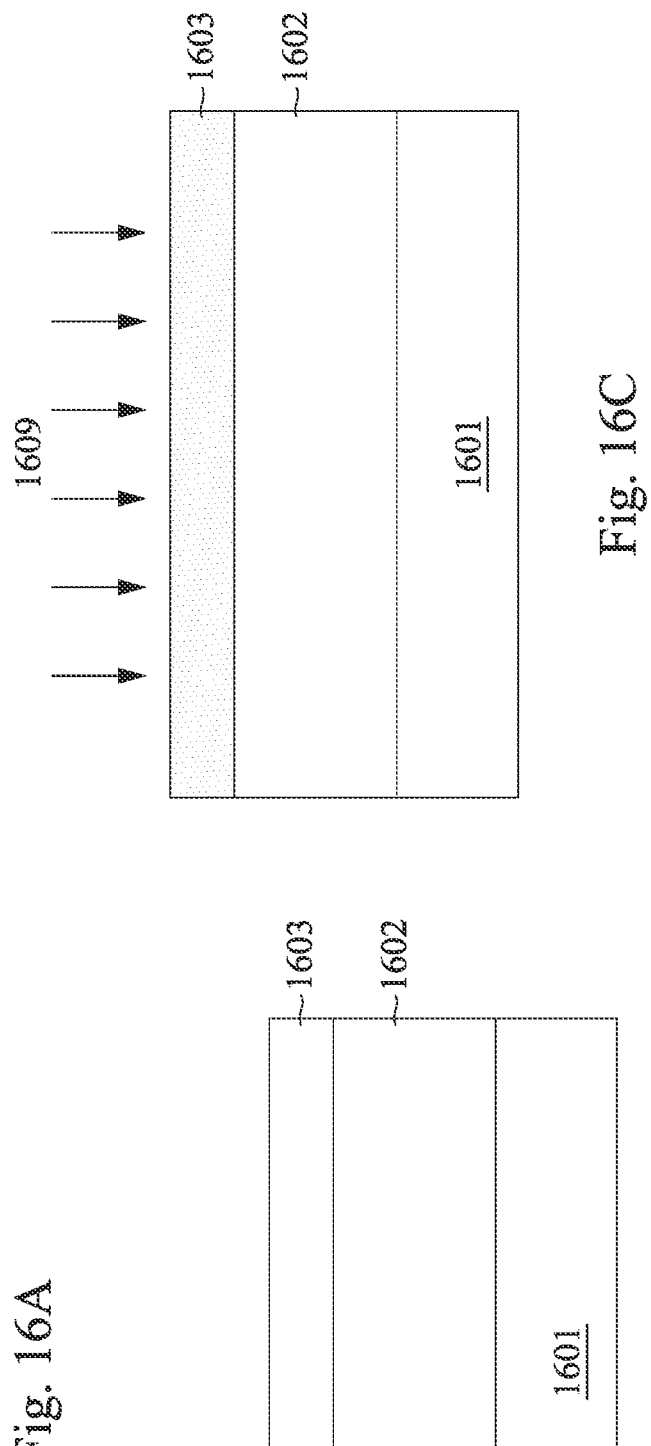

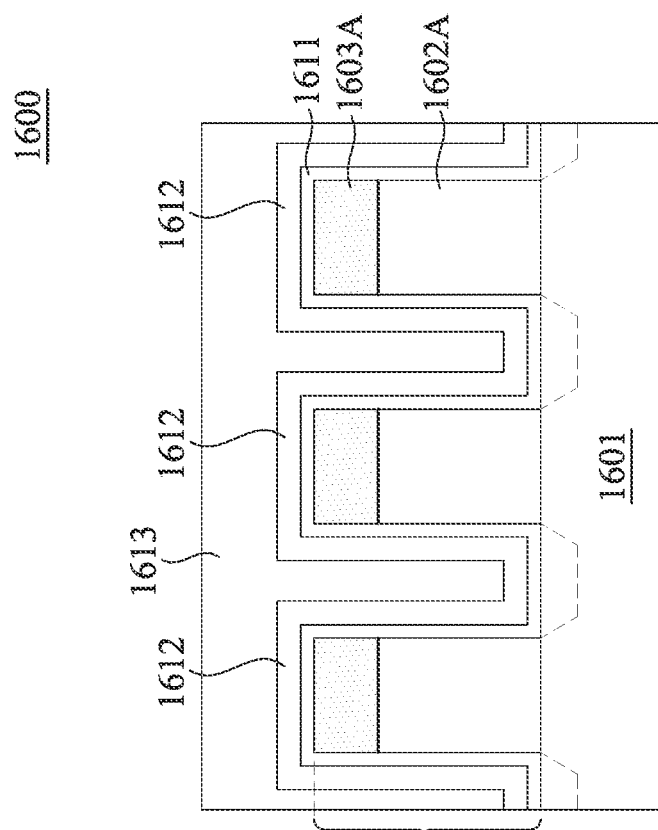
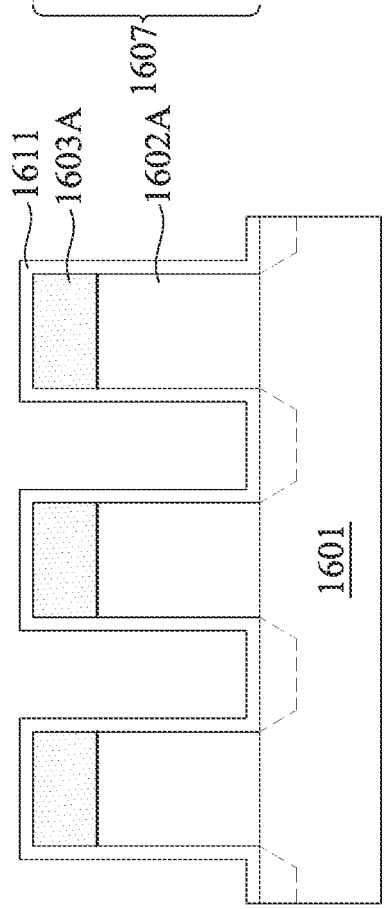

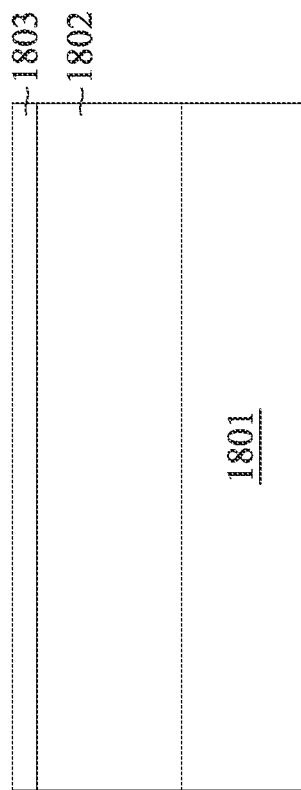
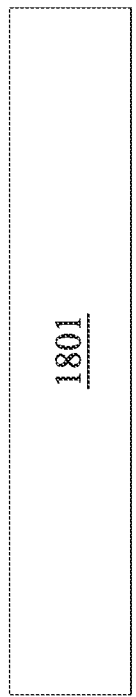
Fig. 18A
Fig. 18B

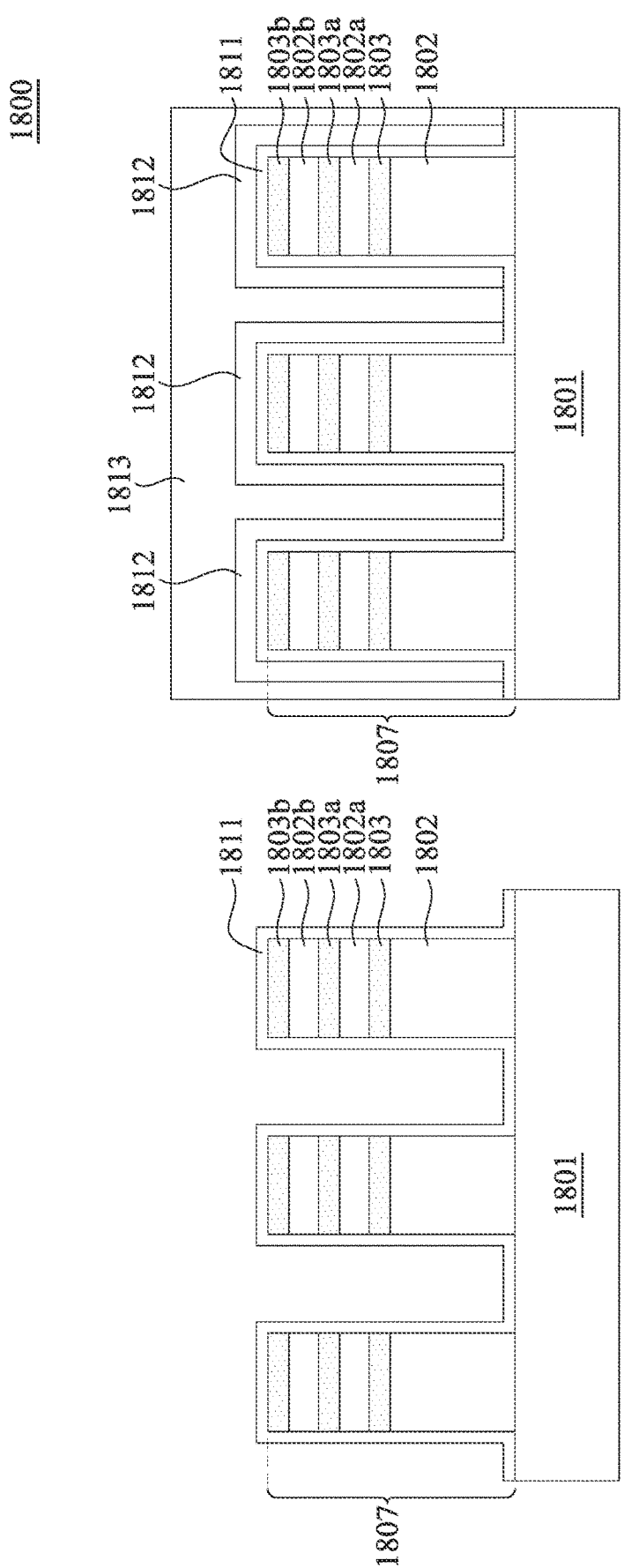

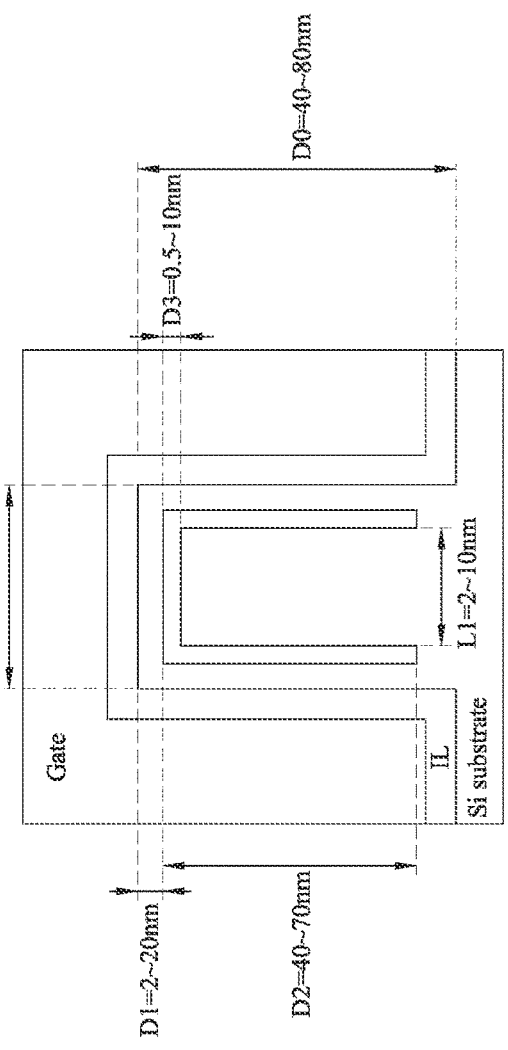
Fig. 43
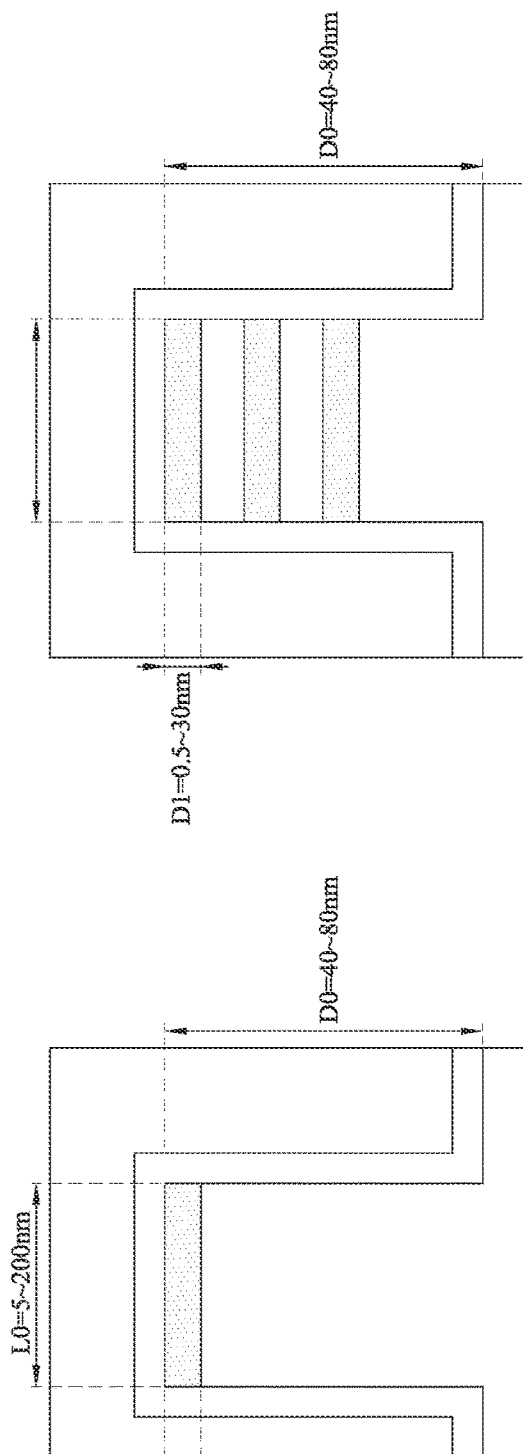
Fig. 44
Fig. 45

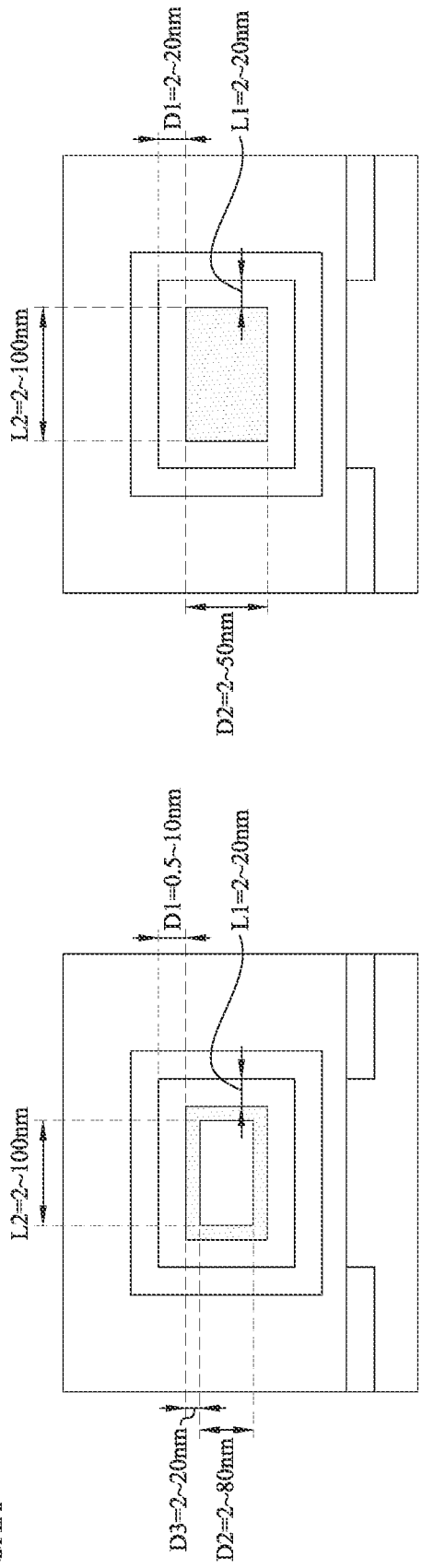
Fig. 46
Fig. 47
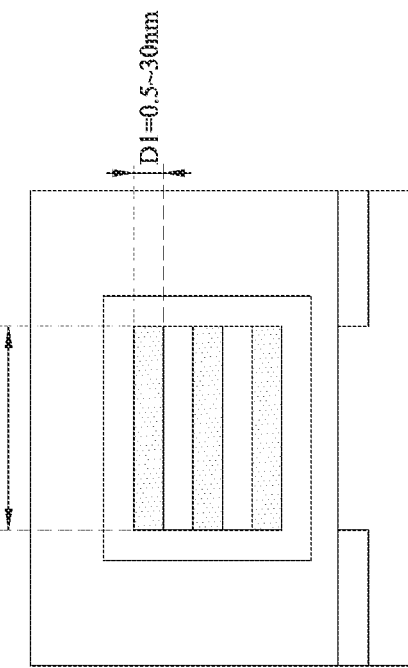
Fig. 48
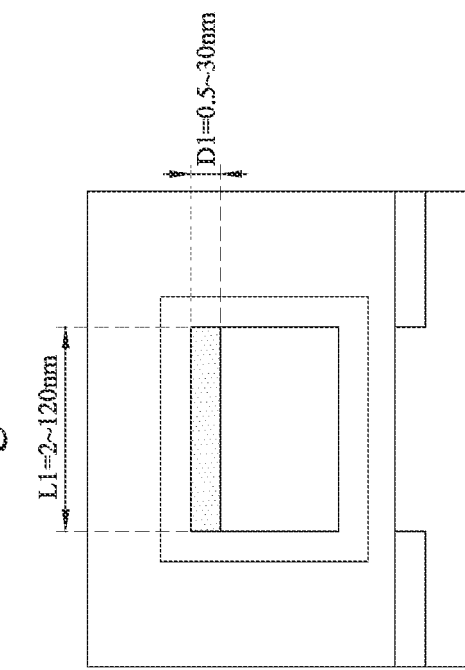
Fig. 49

CHANNEL STRUCTURES INCLUDING DOPED 2D MATERIALS FOR SEMICONDUCTOR DEVICES

CROSS-REFERENCES TO RELATED APPLICATIONS

The application is a divisional application of U.S. patent application Ser. No. 17/400,076, filed Aug. 11, 2021, which claims priority to U.S. Provisional Patent Application 63/173,297, filed on Apr. 9, 2021, entitled "Channel Structures including Doped 2D Materials for Semiconductor Devices," the entire disclosure of which is incorporated herein by reference.

TECHNICAL FIELD

The present disclosure relates to semiconductor devices and, more particularly, to semiconductor structures including doped two-dimensional materials and methods of manufacturing semiconductor devices including fin field effect transistors (FinFETs) and/or gate-all-around (GAA) field effect transistors (FETs) having the semiconductor structures.

BACKGROUND

As the semiconductor industry has progressed into nanometer technology process nodes in pursuit for higher device density, higher performance, and lower costs, challenges from both fabrication and design issues have resulted in the development of three-dimensional designs, such as a multi-gate field effect transistor including a fin field effect transistor (FinFET) and a gate-all-around (GAA) field effect transistors (FET). In a FinFET, a gate electrode is adjacent to three side surfaces of a channel region with a gate dielectric layer interposed therebetween. Because the gate electrode is disposed on three surfaces of the channel region, it can control the current through the channel region from three sides. In a GAA field effect transistor, the gate electrode surrounds or wraps the channel region on all four side surfaces and can control the current through the channel region from four sides. As transistor dimensions are continuously scaled down, further improvements of the channel regions are required.

BRIEF DESCRIPTION OF THE DRAWINGS

The present disclosure is best understood from the following detailed description when read with the accompanying figures. It is noted that, in accordance with the standard practice in the industry, various features are not drawn to scale and are used for illustration purposes only. In fact, the dimensions of the various features may be arbitrarily increased or reduced for clarity.

FIGS. 14A-14F are cross-sectional views illustrating intermediate steps of forming a portion of a semiconductor device according to embodiments.

FIGS. 16A-16G are cross-sectional views illustrating intermediate steps of forming a portion of a semiconductor device according to embodiments.

FIGS. 18A-18H are cross-sectional views illustrating intermediate steps of forming a portion of a semiconductor device according to embodiments. FIGS. 16A-18H are taken in a transversal direction across a channel structure, and the transversal direction is perpendicular to the longitudinal direction across the channel region and the source/drain regions.

FIGS. 43-45 provide exemplary ranges associated with the heights, widths, and thicknesses of exemplary channel structures including doped 2D material layers for a fin-type semiconductor device according to some embodiments.

FIGS. 46-49 provide exemplary ranges associated with the heights, widths, and thicknesses of exemplary channel structures including doped 2D material layers for a gate-all-around (GAA) semiconductor device according to some embodiments.

DETAILED DESCRIPTION

Figure 1A:
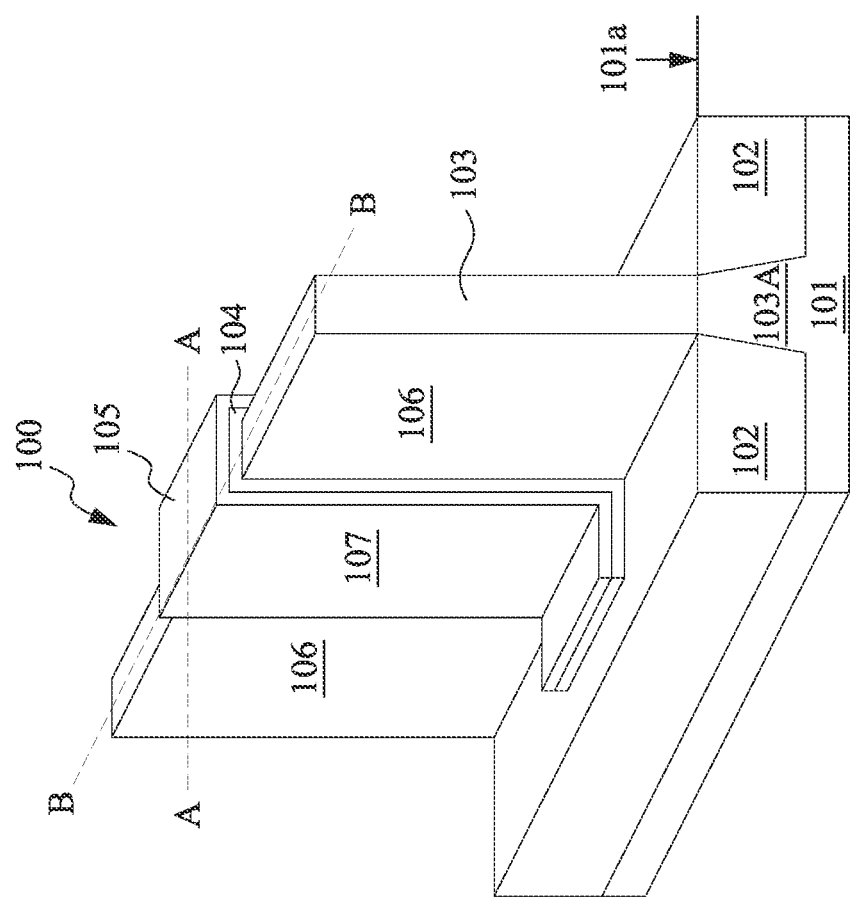
FIG. 1A is a perspective view of a portion of a semiconductor device according to some embodiments.

The present disclosure provides many different embodiments, or examples, for implementing different features of the provided subject matter. Embodiments disclosed herein are merely examples and are not intended to be limiting. For example, dimensions of elements are for illustration only and should not be construed to limit ranges or values of those dimensions in accordance with the disclosure. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term "horizontal" is defined as a plane parallel to the conventional plane or main surface of a wafer or substrate, regardless of the orientation of the wafer or substrate. The term "vertical" refers to a direction perpendicular to the horizontal as defined above. It will be understood that, although the terms "first," "second," "third," etc may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Numerous benefits and advantages are achieved by way of the present disclosure over conventional techniques. For example, embodiments provide a raised channel region that provides a large surface area for interactions with a gate electrode. The large contact area of the channel region with the gate electrode enhances electromagnetic field interactions between the gate electrode and the channel region. As the channel region is further reduced, variations of the channel width account for a larger portion of the total width, that can adversely affect the channel mobility and channel resistance. A reduced channel width causes an increase in a threshold voltage of a semiconductor device. Embodiments overcome problems associated with reduced channel widths by providing channel structures including doped two-dimensional (2D) material layers that enhance channel mobility and threshold voltages of a semiconductor device. High design flexibility can be achieved by selecting a suitable number of doped 2D material layers and doping concentration profiles in the channel structures.

FIG. 1A is a perspective view of a portion of a semiconductor device 10 according to some embodiments. FIG. 1A has been simplified for the sake of clarity and to better illustrate the concepts of the present subject matter. Additional features may be incorporated into the semiconductor device 10, and some of the features described below may be replaced or eliminated for other embodiments of the semiconductor device 10. The semiconductor device 10 is a fin-based semiconductor device, such as a FinFET device, and the concepts of the present disclosure apply equally to other alternatives. Referring to FIG. 1A, the semiconductor device 10 includes a FinFET 100 formed on a substrate 101. Suitable substrate 101 can be a semiconductor substrate or a non-semiconductor substrate. For example, the substrate 101 may include a bulk silicon substrate. In some embodiments, the substrate 101 may include an elementary semiconductor, such as silicon or germanium in a crystalline structure, a compound semiconductor, e.g., silicon germanium, silicon carbide, gallium arsenic, gallium phosphide, indium phosphide, indium arsenide, and/or indium antimonide, or combinations thereof. Possible substrate 101 may also include a semiconductor-on-insulator (SOI) substrate. In an embodiment, the substrate 101 is a silicon layer of an SOI substrate. The substrate 101 can include various doped regions depending on design requirements, e.g., n-type wells or p-type wells. The doped regions are doped with p-type dopants, e.g., boron, n-type dopants, e.g., phosphorous or arsenic, or combination thereof. The doped regions may be formed directly on the substrate 101, in a P-well structure, in an N-well structure, in a dual-well structure, on a raised structure, or in a raised structure. The substrate 101 may also include various active regions for forming N-type metal-oxide-semiconductor transistor (NMOS) devices and P-type semiconductor transistor (PMOS) devices.

The substrate 101 also includes a plurality of isolation regions 102 to electrically isolate circuit devices, e.g., the FinFET 100. In the illustrated embodiment, the isolation regions 102 includes a shallow trench isolation (STI) structure. The isolation regions 102 includes any suitable isolation material, such as a semiconductor oxide, a semiconductor nitride, a semiconductor oxynitride, a semiconductor carbide, fluoride-doped silicate glass (FSG), low-k dielectric material, or the like. The isolation regions 102 may be formed using any suitable deposition process including thermal growth, atomic layer deposition (ALD), chemical vapor deposition (CVD), physical vapor deposition (PVD), and other suitable deposition processes.

The FinFET 100 includes a raised structure (fin structure) 103 extending over the upper surface 101a of the substrate 101, an interfacial layer 104 formed on the raised structure 103, and a gate electrode 105 formed on a portion of the interfacial layer 104. In the case where the silicon layer of the SOI substrate is used, the silicon layer is used to form the raised structure. In some embodiments, the raised structure 103 is made of the same material as the substrate 101. In other embodiments, the raised structure (fin structure) 103 is heteroepitaxially grown and continuously extends from the substrate 101. In the example of FIG. 1A, the substrate is a silicon substrate, and the raised structure 103 is made of silicon. The silicon layer of the raised structure 103 may be intrinsic, or doped with an n-type impurity or a p-type impurity. In FIG. 1A, one raised structure (fin structure) is disposed over the substrate 101. However, the number of fin structures is not limited to one. The number of fin structures can be two or more. The raised structure 103 includes a lower portion 103A embedded in the isolation regions 102. The lower portion 103A is referred to as a well region. The upper portion of the raised structure 103 that is covered by the gate electrode 105 is referred to as a channel region.

In the example of FIG. 1A, the interfacial layer 104 is formed over the entire surface of the raised structure 103. In an embodiment, the interfacial layer 104 may cover a middle portion of the raised structure 103, and the gate electrode 105 is formed on the middle portion of the raised structure 103 that is covered by the interfacial layer 104. In certain embodiments, the interfacial layer 104 is a gate dielectric layer disposed on the channel region, and the gate electrode is disposed on the gate dielectric layer. The portion of the raised structure not covered by the gate dielectric layer functions as a source and/or drain of the FinFET 100. The interfacial layer (gate dielectric layer) 104 includes a single layer or alternatively a multi-layer structure having one or more dielectric materials, such as a single layer of silicon oxide, silicon nitride, high-k dielectric material, any suitable dielectric material, or a multi-layer of two or more of these materials. Examples of high-k dielectric material includes $HfO_2$, HfSiO, HfSiON, HMO, HfSiO, HfZrO, $Pr_2O_3$, zirconium oxide, aluminum oxide, titanium oxide, hafnium dioxide-alumina ($HfO_2$—$Al_2O_3$) alloy. The gate electrode 105 includes one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, and/or combinations thereof. The gate structure can be formed using a gate last process.

The FinFET 100 includes a pair of opposing source/drain regions 106, each of the source/drain regions 106 includes various doped semiconductor materials, and a channel region 107 positioned between the source/drain regions 106. The flow of carriers (electrons for an n-channel device and holes for a p-channel device) through the channel region 107 is controlled by a voltage applied to the gate electrode 105. In the example shown in FIG. 1A, the channel region 107 is raised above the upper surface 101a of the substrate 101 and in contact with the substrate. The gate electrode 105 is disposed on three side surfaces of the channel region 107. The electromagnetic field interactions between the gate electrode 105 and the channel region 107 reduce leakage and short channel effects associated with small semiconductor devices.

In an embodiment, the raised structure 103 is a portion of the substrate 101 that extends through the isolation regions 102. In an embodiment, the channel region 107 has an upper surface co-planar with an upper surface of the source/drain regions 106. In an embodiment, the channel region 107 has an upper surface that is lower than an upper surface of the source/drain regions 106. In an embodiment, the raised structure 103 is a separate semiconductor structure formed on the substrate 101. In an exemplary embodiment, the substrate 101 includes silicon, and the raised structure 103 is formed as a protruding portion of the substrate 101. In another exemplary embodiment, the raised structure 103 includes SiGe.

Figure 1C:
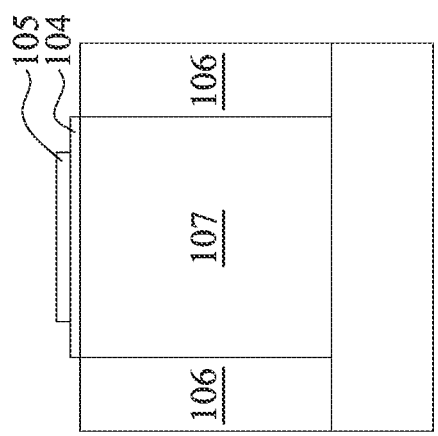
FIG. 1C is a cross-sectional view of the portion of the semiconductor device of FIG. 1A taken along the line B-B.
Figure 1B:
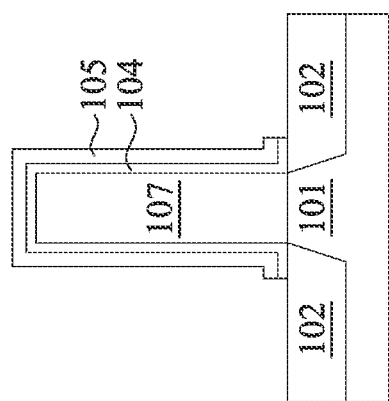
FIG. 1B is a cross-sectional view of the portion of the semiconductor device of FIG. 1A taken along the line A-A.

FIG. 1B is a cross-sectional view of the portion of the semiconductor device 10 of FIG. 1A taken along the line A-A. FIG. 1C is a cross-sectional view of the portion of the semiconductor device 10 of FIG. 1A taken along the line B-B. As shown in FIGS. 1B and 1C, the channel region 107 is disposed between the source/drain region 106, the interfacial layer 104 is disposed on the channel region 107, and the gate electrode 105 is disposed on the interfacial layer 104. In an embodiment, the interfacial layer 104 is formed directly on the raised structure 103 to any suitable thickness using any suitable process including thermal growth, atomic layer deposition (ALD), chemical vapor deposition (CVD), spin-on deposition and other suitable deposition processes. In an embodiment, the interfacial layer 104 may also be formed on the upper surface of the substrate and the isolation regions.

Figure 2A:
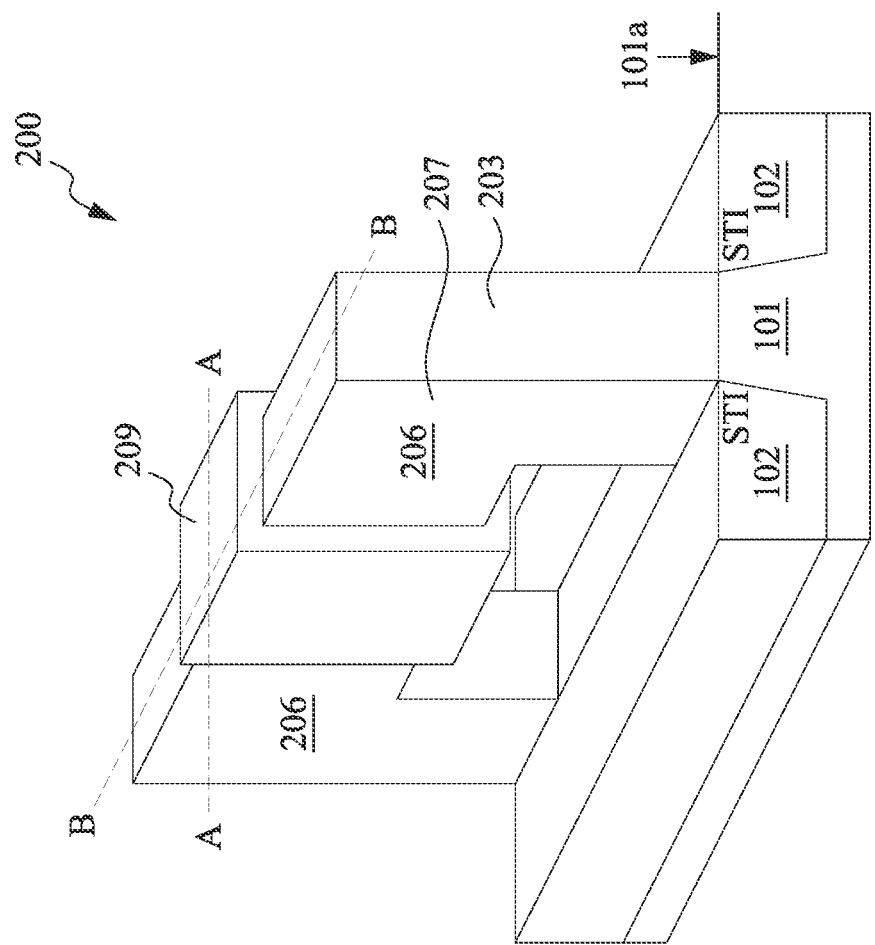
FIG. 2A is a perspective view of a portion of a semiconductor device according to some embodiments.

FIG. 2A is a perspective view of a portion of a semiconductor device 20 according to some embodiments. Referring to FIG. 2A, the semiconductor device 20 is similar to the semiconductor device 10 except that the channel region is suspended over the substrate. Accordingly, description in relation to the elements illustrated in FIG. 1A is applicable to the elements in FIG. 2A as appropriate. The semiconductor device 20 includes a gate-all-around (GAA) device 200 that has a raised structure (fin) 203 extending over the upper surface 101a of the substrate 101, and a gate stack 209 formed on a portion of the raised structure 203. The GAA device 200 also includes a channel region 207 suspended over the substrate and a pair of source/drain regions 206 disposed on opposite sides of the channel region 207. The gate stack 209 includes one or more gate dielectric layers 204 and a gate electrode 205 disposed on the one or more gate dielectric layers (see FIGS. 2B and 2C). The one or more gate dielectric layers 204 include a single layer of silicon oxide, silicon nitride, high-k dielectric material, any suitable dielectric material, or a multi-layer of two or more of these materials. Examples of high-k dielectric material includes $HfO_2$, HfSiO, HfSiON, HMO, HfSiO, HfZrO, $Pr_2O_3$, zirconium oxide, aluminum oxide, titanium oxide, hafnium dioxide-alumina ($HfO_2$—$Al_2O_3$) alloy. The gate electrode 205 includes one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, and/or combinations thereof. The gate stack 209 can be formed using a gate-last process.

The gate stack 209 surrounds (wraps) the channel region 207, i.e., the gate stack 209 is formed on a top surface, sidewall surfaces, and a bottom surface of the channel region 207. Each of the source/drain regions 206 includes various doped semiconductor materials. The flow of carriers (electrons for an n-channel device and holes for a p-channel device) through the channel region 207 is controlled by a voltage applied to the gate electrode 205 of the gate stack 209. In the example shown in FIG. 2A, the channel region 207 is raised above the upper surface 101a of the substrate 101 and suspended over the substrate 101. In this embodiment, the channel region 207 is suspended over the substrate 101 via the source/drain regions 206, i.e., the source/drain regions 206 are formed on (in direct contact with) the substrate 101 and are coupled to each other through the channel region 207, which forms a bridging structure extending along the direction of B-B, and the gate stack 209 surrounds the channel region 207 on all four surface sides (top, sidewall, and bottom sides).

Figure 2C:
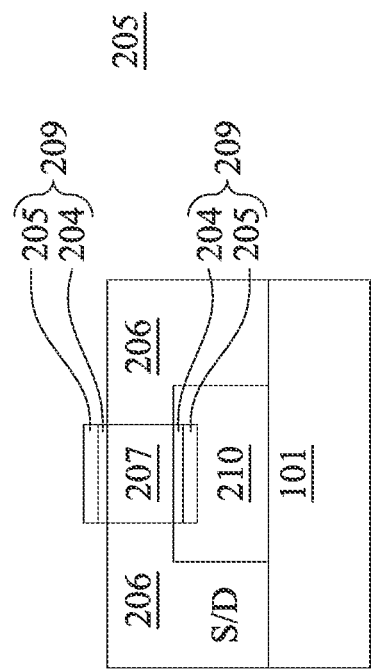
FIG. 2C is a cross-sectional view of the portion of the semiconductor device of FIG. 2A taken along the line B-B.
Figure 2B:
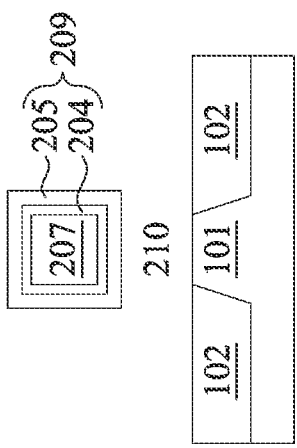
FIG. 2B is a cross-sectional view of the portion of the semiconductor device of FIG. 2A taken along the line A-A.

FIG. 2B is a cross-sectional view of the portion of the semiconductor device 20 of FIG. 2A taken along the line A-A, and FIG. 2C is a cross-sectional view of the portion of the semiconductor device 20 of FIG. 2A taken along the line B-B. Referring to FIGS. 2B and 2C, the channel region 207 is suspended over the substrate 101 and forms a bridging structure connecting the source/drain regions 206, i.e., the channel region 207 is suspended over the substrate 101 and supported by the source/drain regions 206. The gate stack including one or more dielectric layers 204 and a gate electrode 205 on the one or more dielectric layers 204 is formed on all sides (top surface, bottom surface, and side surfaces) of the channel region 207. In this embodiment, the gate electrode 205 does not have contact with the substrate 101, as indicated by an air gap between the gate stack 209 and the substrate 101. In some other embodiments, the gate stack 209 can be in contact with the substrate 101.

Figure 3A:
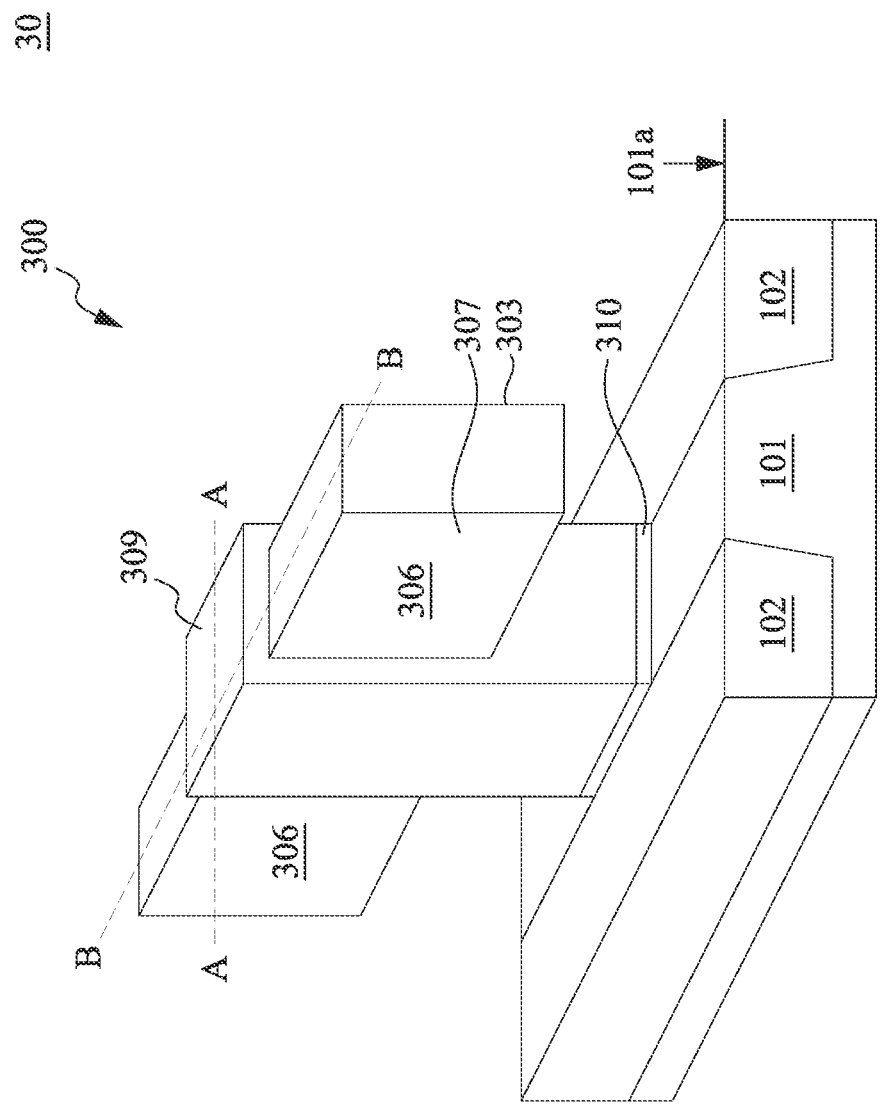
FIG. 3A is a perspective view of a portion of a semiconductor device according to some embodiments.

FIG. 3A is a perspective view of a portion of a semiconductor device 30 according to some embodiments. Referring to FIG. 3A, the semiconductor device 30 is similar to the semiconductor device 10 except for the differences described herein. Accordingly, description in relation to the elements illustrated in FIG. 1A is applicable to the elements in FIG. 3A as appropriate. The semiconductor device 30 includes a FinFET 300 that has a suspending structure 303 disposed over the upper surface 101a of the substrate 101. The suspending structure 303 is supported by a gate structure 309 formed on a surface portion of the substrate 101. The suspending structure 303 includes a channel region 307 and a pair of source/drain regions 306 disposed on opposite sides of the channel region 307. The gate structure 309 includes one or more gate dielectric layers 304 and a gate electrode 305 disposed on the one or more gate dielectric layers (see FIGS. 3B and 3C). The one or more gate dielectric layers 304 include a single layer of silicon oxide, silicon nitride, high-k dielectric material, any suitable dielectric material, or a multi-layer of two or more of these materials. Examples of high-k dielectric material includes $HfO_2$, HfSiO, HfSiON, HMO, HfSiO, HfZrO, $Pr_2O_3$, zirconium oxide, aluminum oxide, titanium oxide, hafnium dioxide-alumina ($HfO_2$—$Al_2O_3$) alloy. The gate electrode 305 includes one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, and/or combinations thereof. The gate structure 309 surrounds (wraps) the channel region 307, i.e., the gate structure 309 is formed on a top surface, sidewall surfaces, and a bottom surface of the channel region 307. Each of the source/drain regions 306 includes various doped semiconductor materials. The flow of carriers (electrons for an n-channel device and holes for a p-channel device) through the channel region 307 is controlled by a voltage applied to the gate electrode 305 of the gate structure 309. In the example shown in FIG. 3A, the source/drain regions 306, and the channel region 307 are disposed above the upper surface 101a of the substrate 101 and supported by the gate stack 309, which is disposed on the substrate 101. In this embodiment, the source/drain regions 306 and the channel region 307 are suspended over the substrate 101 via the gate structure 309, which is formed on (in direct contact with) the substrate 101. In some other embodiments, the gate structure 309 may include a dielectric layer 310 disposed between the gate structure 309 and the substrate 101 configured to electrically insulate the conductive portion of the gate structure. In some embodiments, the dielectric layer 310 can include $SiO_2$, SiN, SiON, and combinations thereof. In some embodiments, the dielectric layer 310 is omitted.

Figure 3C:
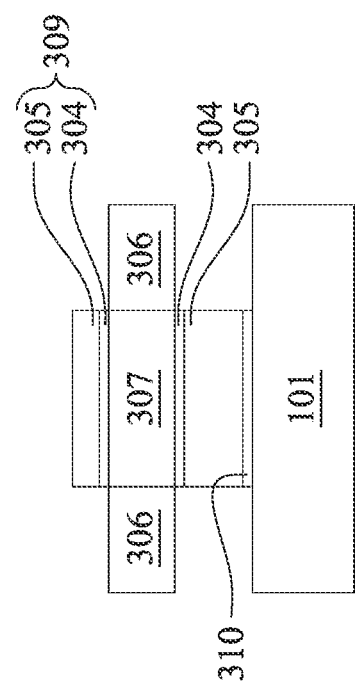
FIG. 3C is a cross-sectional view of the portion of the semiconductor device of FIG. 3A taken along the line B-B.
Figure 3B:
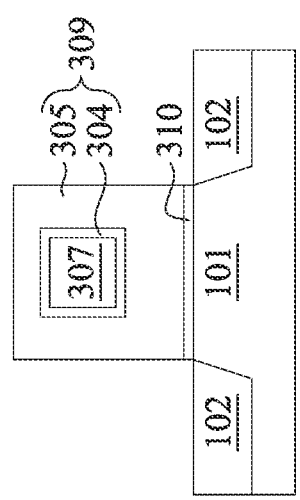
FIG. 3B is a cross-sectional view of the portion of the semiconductor device of FIG. 3A taken along the line A-A.

FIG. 3B is a cross-sectional view of the portion of the semiconductor device 30 of FIG. 3A taken along the line A-A, and FIG. 3C is a cross-sectional view of the portion of the semiconductor device 30 of FIG. 3A taken along the line B-B. Referring to FIGS. 3B and 3C, the channel region 307 and the source/drain regions 306 are suspended over the substrate 101. The gate structure 309 including one or more dielectric layers 304 and a gate electrode 305 on the one or more dielectric layers 304 is disposed on all sides (i.e., surrounds or wraps) the channel region 307 and provides support to the channel region 307 and the source/drain regions 306.

The embodiments illustrated and described with reference to FIGS. 1A-1C, FIGS. 2A-2C, and FIGS. 3A-3C provide semiconductor structures for forming FinFET devices and GAA devices. It is understood that embodiments of the present disclosure are not so limited.

As used herein, the term "2D material" may refer to crystalline solids consisting of a single layer of atoms. The term "pristine material" refers to a material which has not been subject to a pre-treatment, e.g., an oxidation treatment, a plasma treatment, and the like. For example, a pristine silicon (Si) or silicon germanium (SiGe) material means a Si or SiGe material containing no significant density of oxygen, hydrogen, or other non-Si or SiGe materials or elements. The semiconductor structure having a first portion of a 2D material layer on the top surface and a second portion of the 2D material layer on sidewall surfaces of the channel region and a pristine channel material on the 2D material layer improves short channel performance and channel mobility of a semiconductor device (FinFET). Details of doped 2D material layers will be described in more detail below with reference to FIGS. 11-12.

Figure 4:
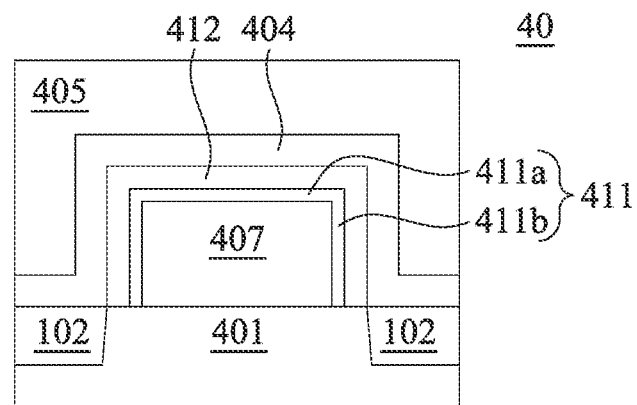
FIG. 4 is a cross-sectional view of a semiconductor structure according to an embodiment.

FIG. 4 is a cross-sectional view of a semiconductor structure 40 according to an embodiment. Referring to FIG. 4, the semiconductor structure 40 includes a substrate 401, a channel region 407 disposed on the substrate 401 and including a doped two-dimensional (2D) material layer 411 having a first portion 411a on a top surface and a second portion 411b on sidewall surfaces of the channel layer 407, a semiconductor layer 412 on the 2D material layer 411, an interfacial layer 404 on the semiconductor layer 412, and a gate electrode 405 on the interfacial layer 404. In an embodiment, the semiconductor layer 412 is a pristine channel material layer. In an embodiment, the channel region 407, the doped 2D material layer 411, and the semiconductor layer 412 form a channel region of a semiconductor device, e.g., a transistor. In an embodiment, the 2D material layer 411 may include one or more monolayers of 2D materials stacked with each other. The one or more monolayers of 2D materials can be doped with a p-type dopant or an n-type dopant. The 2D material layer 411 can have an approximate constant doping concentration and/or a gradient of doping concentration (graded doping concentration). The semiconductor structure 40 also includes a shallow trench isolation structure (STI) 102 surrounding active regions of the substrate 401.

Figure 5:
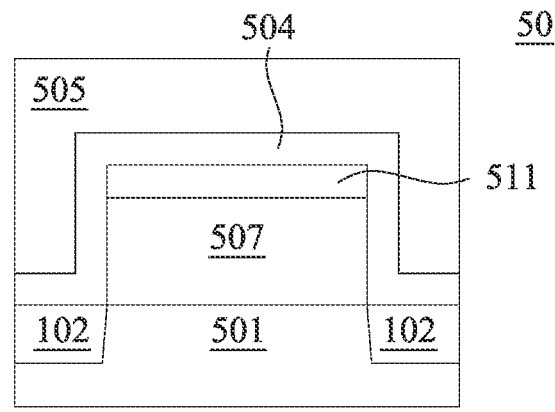
FIG. 5 is a cross-sectional view of a semiconductor structure according to an embodiment.

FIG. 5 is a cross-sectional view of a semiconductor structure 50 according to an embodiment. Referring to FIG. 5, the semiconductor structure 50 includes a substrate 501, a channel region 507 disposed on the substrate 501 and having a doped 2D material layer 511 on its upper surface, an interfacial layer 504 on the doped 2D material layer 511 and sidewall surfaces of the channel region 507, a gate electrode 505 on the interfacial layer 504, and a shallow trench isolation structure (STI) 102 surrounding active regions of the substrate 501. In an embodiment, the doped 2D material layer 511 on the top surface of the channel region 507 improves short channel performance and channel mobility of a semiconductor device. In an embodiment, the 2D material layer 511 may include one or more monolayers of 2D materials stacked on top of each other. In an embodiment, the 2D material layer 511 has a thickness in a range between about 0.5 nm and about 30 nm. The one or more monolayers of 2D materials can be doped with a p-type dopant or an n-type dopant. In an embodiment, the 2D material layer 511 can have an approximate constant doping concentration and/or a graded doping concentration.

Figure 6:
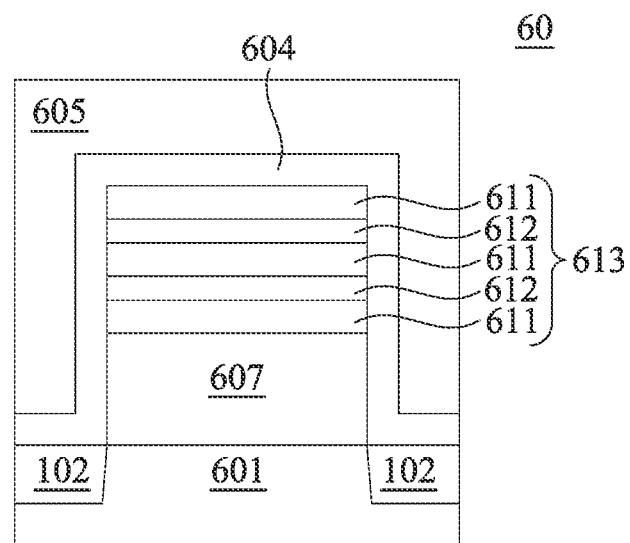
FIG. 6 is a cross-sectional view of a semiconductor structure according to another embodiment.

FIG. 6 is a cross-sectional view of a semiconductor structure 60 according to another embodiment. Referring to FIG. 6, the semiconductor structure 60 includes a substrate 601, a channel region 607 having an alternating stack 613 of doped 2D material layers 611 and semiconductor layers 612 formed on the substrate 601, an interfacial layer 604 on a top surface and sidewall surfaces of the channel region 607 including the alternating stack 613, a gate electrode 605 on the interfacial layer 604, and a shallow trench isolation structure (STI) 102 surrounding active regions of the substrate 601. In an embodiment, the semiconductor layers 612 each may include a pristine channel material. The doped 2D material layers 611 may be referred to as semiconductor nanosheets. The semiconductor layers 612 may be referred to as spacers or sheet-to-sheet spacers. It is understood that the number of doped material layers 611 and pristine channel material layer 612 can be any integer number. In the example shown in FIG. 6, three doped material layers and two pristine channel material layers are used in the channel region, but it is understood that the number is illustrative only and is chosen for describing the example embodiment and should not be limiting. For example, the semiconductor structure 60 can have a first doped 2D material layer formed as a bottom portion of the channel region, and a last doped 2D material layer formed as a top portion of the channel region.

Figure 7:
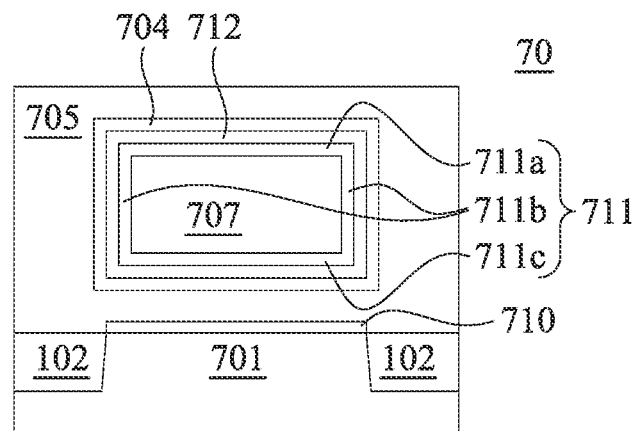
FIG. 7 is a cross-sectional view of a semiconductor structure according to an embodiment.

FIG. 7 is a cross-sectional view of a semiconductor structure 70 according to an embodiment. Referring to FIG. 7, the semiconductor structure 70 includes a substrate 701, and a channel region 707 suspended over the substrate 701 and including a doped two-dimensional (2D) material layer 711. The doped 2D material layer includes a upper portion 711*a* on an upper surface, a second portion 711*b* on opposite sidewall surfaces, and a bottom portion 711*c* on a lower surface of the channel layer 707. The semiconductor structure 70 also includes a semiconductor layer 712 on the 2D material layer 711, an interfacial layer 704 surrounding the semiconductor layer 712, and a gate electrode 705 surrounding the interfacial layer 704. In an embodiment, the semiconductor layer 712 is a pristine channel material layer. The semiconductor structure 70 also includes a shallow trench isolation structure (STI) 102 surrounding active regions of the substrate 701. In an embodiment, the semiconductor structure also includes a gate dielectric layer 710 disposed on the active regions of the substrate.

Figure 8:
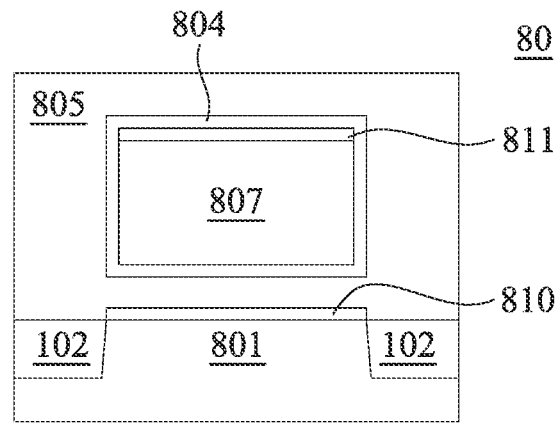
FIG. 8 is a cross-sectional view of a semiconductor structure according to an embodiment.

FIG. 8 is a cross-sectional view of a semiconductor structure 80 according to an embodiment. Referring to FIG. 8, the semiconductor structure 80 includes a substrate 801, a channel region 807 suspended over the substrate 801 and including a doped two-dimensional (2D) material layer 811 on its upper surface, an interfacial layer 804 surrounding the channel region 807 including the doped 2D material layer 811, and a gate electrode 805 surrounding the interfacial layer 804. In an embodiment, the semiconductor structure 80 also includes a shallow trench isolation structure (STI) 102 surrounding active regions of the substrate 801 and a gate dielectric layer 810 disposed on the active regions of the substrate 801.

Figure 9:
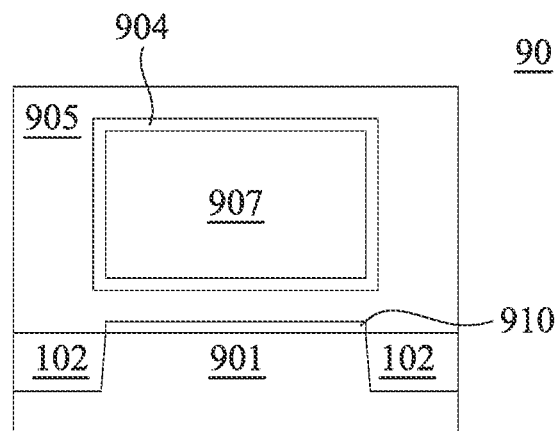
FIG. 9 is a cross-sectional view of a semiconductor structure according to an embodiment.

FIG. 9 is a cross-sectional view of a semiconductor structure 90 according to an embodiment. Referring to FIG. 9, the semiconductor structure 90 includes a substrate 901, a channel region 907 suspended over the substrate 901 and including a doped two-dimensional (2D) material, an interfacial layer 904 surrounding the channel region 907, and a gate electrode 905 surrounding the interfacial layer 904. In an embodiment, the semiconductor structure 90 also includes a shallow trench isolation structure (STI) 102 surrounding active regions of the substrate 901 and a gate dielectric layer 910 disposed on the active regions of the substrate 901. In an embodiment, the doped 2D material has a non-uniform doping concentration. In an embodiment, doped 2D material has a graded doping profile that linearly increases from the bottom to the top of the channel region 907. In an embodiment, the doped 2D material has a graded doping profile that exponentially increases from the bottom to the top of the channel layer 907. A graded doping concentration can enhance the conductivity of the channel layer 907. For example, the linearly or exponentially increasing graded doping concentration can be obtained by progressively increasing the doping precursor concentration when forming the doped 2D material in the channel region 907. A semiconductor device having doping concentration gradients exhibits high drive current, low off-leakage, low parasitic capacitance, and low body effect when operating a low supply voltages.

Figure 10:
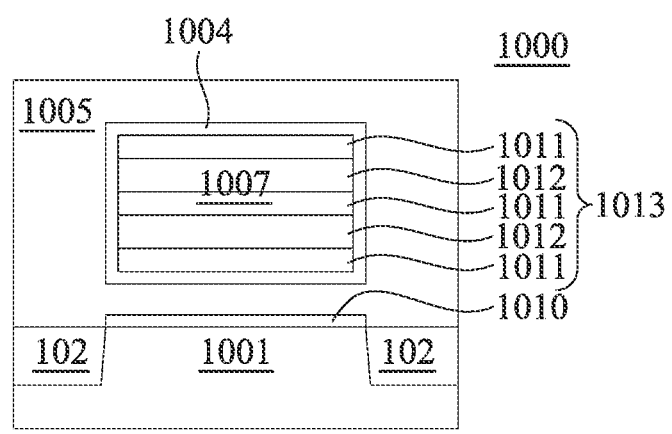
FIG. 10 is a cross-sectional view of a semiconductor structure according to an embodiment.

FIG. 10 is a cross-sectional view of a semiconductor structure 1000 according to an embodiment. Referring to FIG. 10, the semiconductor structure 1000 includes a substrate 1001, a channel structure 1007 having a stack 1013 of alternating doped 2D material layers 1011 and semiconductor layers 1012 over the substrate, an interfacial layer 1004 surrounding the channel structure 1007 including the stack 1013, a gate electrode 1005 surrounding the interfacial layer 1004, and a shallow trench isolation structure (STI) 102 surrounding active regions of the substrate 1001. In an embodiment, the semiconductor structure 1000 optionally includes a gate dielectric layer 1010 disposed on the active regions of the substrate 1001. In the example shown in FIG. 10, three doped 2D material layers 1011 and two semiconductor layers 1012 are used in the channel region, but it is understood that the number is illustrative only and is chosen for describing the example embodiment and should not be limiting. In some embodiments, the semiconductor layers include a pristine channel material.

FIGS. 4 through 10 provide different exemplary semiconductor structures according to some embodiments. These semiconductor structures have been simplified for the sake of clarity and for illustration of the concepts of the present disclosure. It is understood that additional features can be incorporated into these semiconductor structures, and some of the features can be replaced or eliminated in other embodiments.

Figure 11:
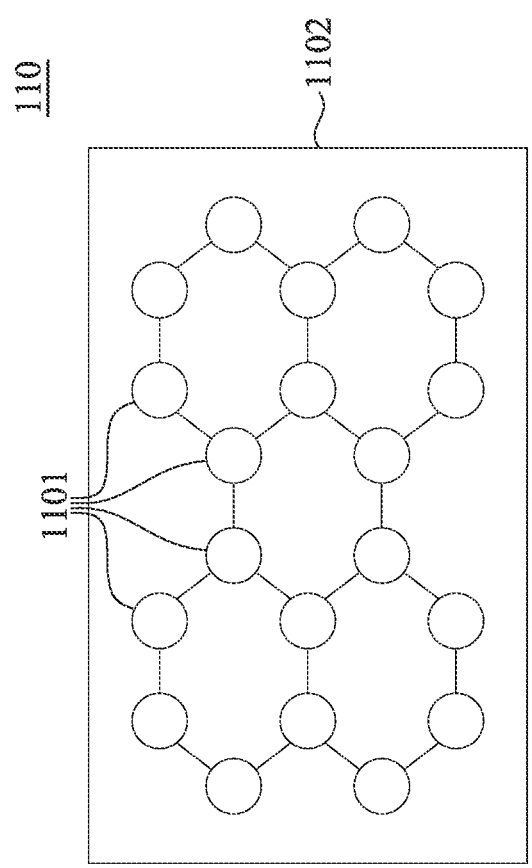
FIG. 11 is a molecular diagram of a two-dimensional (2D) material according to some embodiments.

FIG. 11 is a molecular diagram of a two-dimension material 110 according to some embodiments. Referring to FIG. 11, a molecular diagram of a graphene includes a plurality of carbon atoms 1101 arranged along a single plane 1102 for forming the two-dimension material 110. Pristine graphene has high carrier mobility, but does not have an energy bandgap, so that graphene cannot be turned off effectively, which may be required for many transistors. In some embodiments, graphene can be doped with one or more impurities to enhance channel mobility. In some embodiments, the graphene can be doped with boron (B), aluminum (Al), gallium (Ga), and others to create an energy bandgap for a p-channel semiconductor device. In some other embodiments, the graphene can be doped with nitrogen (N), sulfur (S), phosphorous (P), and others for an n-channel semiconductor device In an embodiment, graphene layers can be epitaxially grown or deposited by chemical vapor deposition (CVD). The graphene layer has a very small thickness of about 0.5 nm. In some embodiments, the graphene can be doped with dopant concentrations in a range from about 1E19 ($10^{19}$) atoms/cm$^3$ to 1E22 ($1^{22}$) atoms/cm$^3$.

Figure 12:
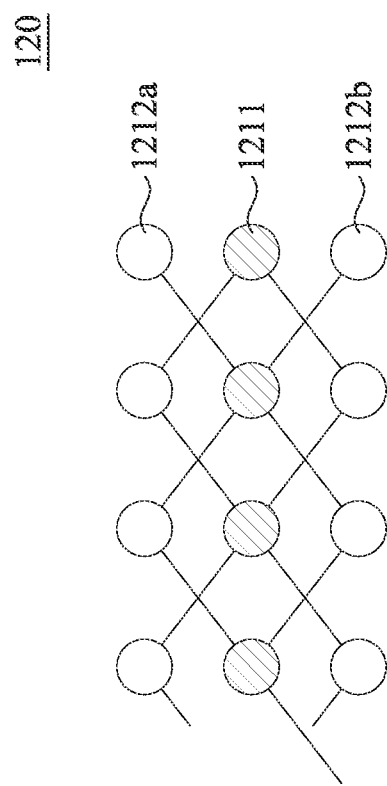
FIG. 12 is a molecular diagram of a two-dimensional (2D) material according to some embodiments.

FIG. 12 is a molecular diagram of a two-dimension material 120 according to some embodiments. Referring to FIG. 12, a transition metal atoms 1211 form a middle layer in the middle and the chalcogen atoms forms a first layer 1212a over the transition metal atoms 1211 and a second layer 1212b under the layer of the transition metal atoms 1211. The transition metal atoms 1211 can be W atoms, Mo atoms, Ti atoms, Nb atoms, Zr atoms, Ga atoms, Sn atoms, and the like. The chalcogen atoms 1212 can be S atoms, Se atoms, Te atoms, and the like. In the example shown in FIG. 12, each of the transition metal atoms 1211 is bonded to four chalcogen atoms 1212, and each chalcogen atoms 1212 is bonded to two transition metal atoms 1211. Similar to graphene, transition metal dichalcogenide materials have high conductivity and carrier mobility suitable for forming thin-sheet FinFET and GAA devices. In some embodiments, the 2D material of $MoS_2$, $WS_2$, $WSe_2$, $MoSe_2$ may represent a semiconducting alternative to graphene. In some embodiments, the $MoS_2$, $WS_2$, $WSe_2$, $MoSe_2$ may be doped with dopant concentrations in a range from about $1\times10^{19}$ atoms/cm$^3$ to about $1\times10^{22}$ atoms/cm$^3$.

Figure 13:
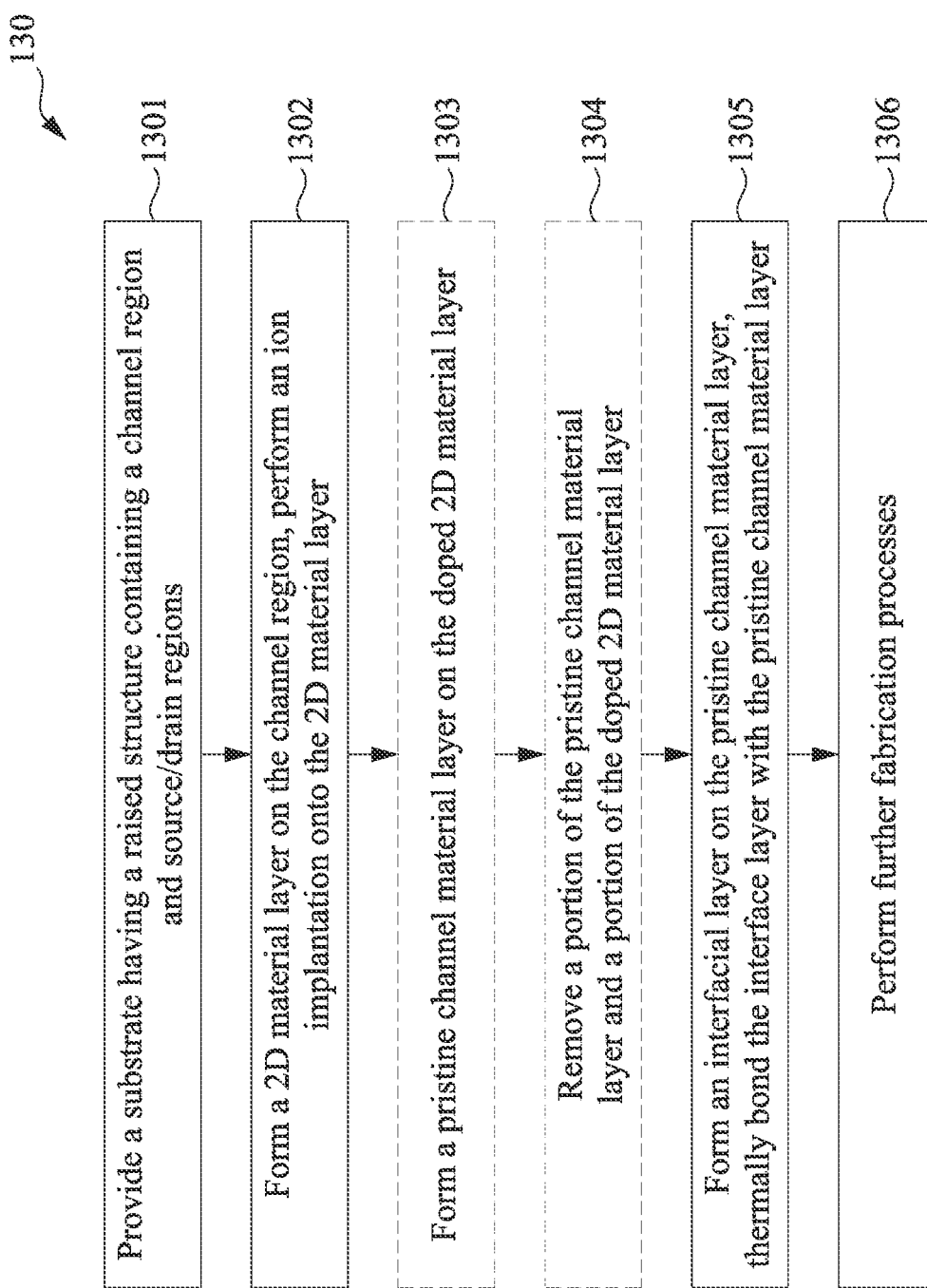
FIG. 13 is a flowchart illustrating a method of manufacturing a semiconductor device according to some exemplary embodiments.

FIG. 13 is a flowchart illustrating a method 130 of manufacturing a semiconductor device according to some exemplary embodiments. It is understood that additional steps can be provided before, during, and after steps of method 130, and some of the steps can be replaced or eliminated for other embodiments of the method. The method 130 includes providing a substrate (step 1301). The substrate may be substantially similar to the substrate 101, 401-1001 of FIGS. 1-10. The substrate may include an elementary semiconductor, a compound semiconductor, an insulator, or other suitable substrate materials. The substrate may have a raised structure including a channel region, source/drain regions disposed on opposite sides of the channel region, and a gate structure on the channel region. The raised structure may be formed using photolithography processes including forming a photoresist layer, patterning the photoresist layer, etching the substrate to produce the raised structure with a suitable height and width protruding above the remainder of the substrate. The raised structure thus formed can include a plurality of protruding regions and a plurality of recesses which separate the protruding regions.

The raised structure is used to form one or more FinFET devices or GAA FET devices. In an embodiment, the substrate is a silicon substrate, and a pristine semiconductor layer is epitaxially grown on the substrate, and the raised structure is then formed by a photolithography process, i.e., the channel region includes silicon. In an embodiment, the substrate is a silicon substrate, and a pristine semiconductor layer including silicon germanium (SiGe) is heteroepitaxially grown on the substrate, and the raised structure including SiGe is formed by a photolithography process. In an embodiment, the pristine semiconductor layer is deposited on the substrate by chemical vapor deposition. Step 1301 also includes forming an isolation trench structure in the recesses, e.g., a shallow trench isolation structure (STI) surrounding active regions of the substrate. The STI may include a semiconductor oxide, a semiconductor nitride, a semiconductor oxynitride, SiOCN, fluorosilicate glass (FSG), a low-k dielectric material, or the like formed using a chemical vapor deposition (CVD) process, a spin-on process, and other suitable deposition process.

The method 130 also includes forming a 2D material layer on the channel region of the raised structure. In an embodiment, the 2D material layer may include graphene that is deposited using an aqueous solution of graphene oxide. In some embodiments, the 2D material layer includes grapheme-based material by a dry thermal release tape process. In an embodiment, the 2D material layer may include a $MoS_2$ layer, a $MoSe_2$ layer, a $WS_2$ layer, or a $WSe_2$ layer. The method 130 also includes doping the 2D material layer by performing an ion implantation process (step 1302). In an embodiment, the ion implantation may include p-type dopants, e.g., boron (B). In another embodiment, the ion implantation may include n-type dopants, e.g., nitrogen (N). The ion implantation can be performed at a vertical implantation and/or at an implantation angle relative to the surface of the substrate.

In an embodiment, the method 130 optionally includes forming a pristine channel material layer on the doped 2D material layer (step 1303) and removing a portion of the pristine channel material layer and a portion of the doped 2D material layer in the recesses (step 1304) to expose a surface of the substrate. Steps 1303 and 1304 are optional, so that the steps are indicated by dotted line boxes. The method 130 further includes forming an interfacial layer on the pristine channel material layer and the exposed surface of the substrate. The method 130 also includes heating the semiconductor device to thermally bond the interfacial layer with the pristine channel material layer (step 1305). In some embodiments, the thermal bonding is performed at a temperature ranging from about 400° C. to about 1200° C. If the temperature is small than 400° C., the leakage current of the device increases, in some instances. If the temperature is great than 1200° C., the dopants diffuses into the nearby semiconductor material, resulting in insufficient dopant concentration, in some instances. The method 130 further includes other fabrication processes (step 1306), such as forming a patterned gate electrode on the interfacial layer, forming an interlayer dielectric layer, forming through-holes extending through the interlayer dielectric layer, and filling the through-holes with a conductive material to form contacts that are electrically coupled to the gate electrode and the source/drain regions.

Figure 14B:
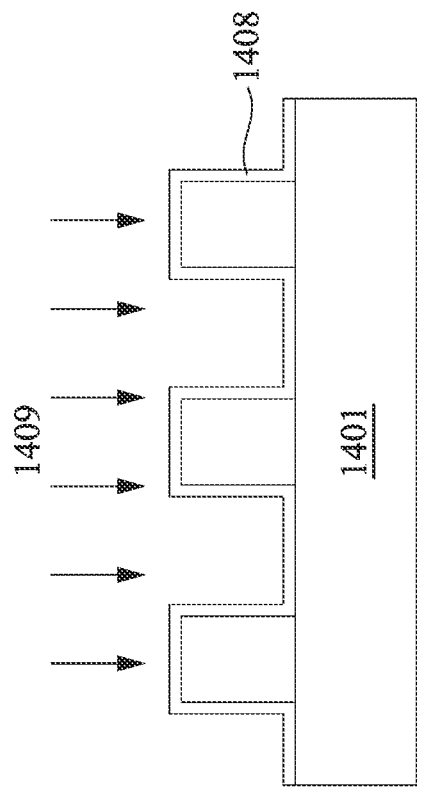
Figure 14A:
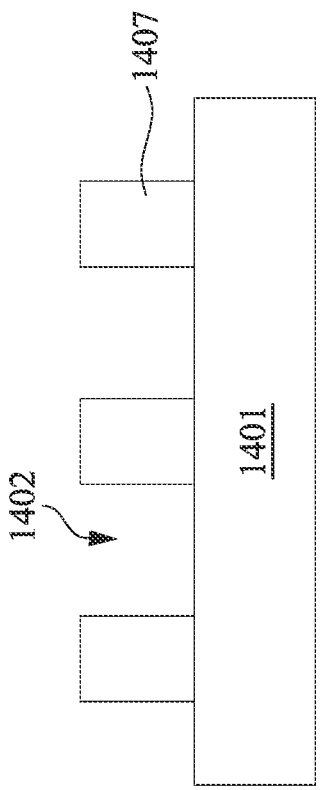
Figure 14C:
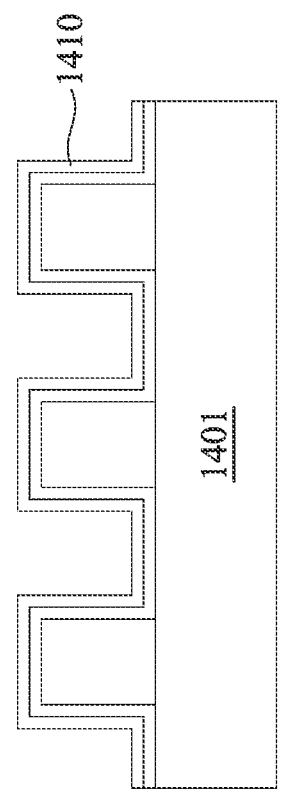
Figure 14D:
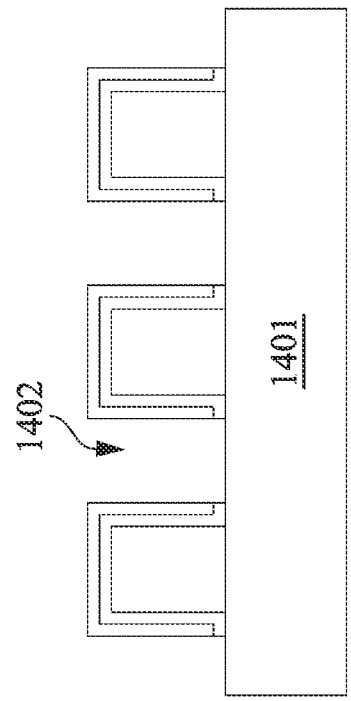

FIGS. 14A-14F are cross-sectional views illustrating intermediate steps of forming a portion of a semiconductor device according to embodiments. FIGS. 14A-14F will be described together with reference to FIG. 13. Referring to FIG. 14A and step 1301, a portion of the semiconductor device is shown having already undergone several process operations. A raised structure having three channel regions 1407 is disposed on a substrate 1401, a recess region 1402 is disposed between the channel regions 1407 and can be filled with an insulating material. Referring to FIG. 14B and step 1302, a 2D material layer 1408 is formed on the channel regions 1407 by chemical vapor deposition. An ion implantation 1409 is performed on the 2D material layer 1408. The ion implantation 1409 including N-type dopants (e.g., N) or P-type dopants (e.g., B) can be performed vertically and/or at an oblique angle with respect to the surface of the substrate 1401. In some embodiments, the ion implant process can adjust the implant energy, the dopant dose, and the implant temperature to vary the doping concentration along the thickness of the 2D material layer 1408. In some embodiments, the ion implant process also adjusts the implant parameters to provide a desired or target doping concentration profile to the 2D material layer 1408. Thereafter, a semiconductor material (e.g., Si or SiGe) 1410 is blanket deposited on the doped 2D material layer 1408, as shown in FIG. 14C and step 1303. In some embodiments, the semiconductor material 1410 includes a pristine channel semiconductor material. Referring to FIG. 14D and step 1304, a portion of the pristine channel material and a portion of the doped 2D material layer are removed by etching to expose a surface region of the substrate. In an exemplary etch process, a patterned mask layer, e.g., SiN, is formed over the channel regions 1407 by chemical vapor deposition, and a reactive ion etching process is carried out to anisotropically etch the portion of the pristine channel material and a portion of the doped 2D material layer in the recess region 1402. Referring to FIG. 14E and step 1305, a conformal interfacial layer 1411 is formed (blanket deposited) on the pristine channel material layer and the exposed surface of the substrate. The conformal interfacial layer 1411 includes an insulating material to reduce a roughness at the interface between a subsequent formed gate electrode and the pristine channel material. Thereafter, a thermal treatment is carried out to thermally bond the interfacial layer with the pristine channel material. In an embodiment, the thermal treatment is carried out at a temperature from about 400° C. to about 1200° C. Referring to FIG. 14F and step 1306, a conductive layer is formed on the interfacial layer 1411 form a gate electrode 1412, an interlayer dielectric layer 1413 is formed over the gate electrode 1412, a planarizing process, e.g., a chemical mechanical polishing (CMP), is carried out to planarize the upper surface of the interlayer dielectric layer 1413. In an embodiment, the conductive layer can include one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, and/or combinations thereof. One of skill in the art will appreciate that other process steps can also be performed, and various alterations and modifications may be practiced. For example, source/drain regions can be formed in a gate last process, the interlayer dielectric layer can be formed on the source/drain regions, through-holes can be formed extending through the interlayer dielectric layer, and the through-holes can be filled with a conductive material to form contacts that are electrically coupled to the gate electrode, the source/drain regions.

FIG. 14F is a cross-sectional view illustrating a channel structure 1400 according to an embodiment. The channel structure 1400 includes the channel region 1407 disposed on the substrate 1401, the doped 2D material layer 1408 disposed on an upper surface and sidewall surfaces of the channel region 1407, the pristine channel material 1410 disposed on the doped 2D material layer 1408, the interfacial layer 1411 disposed on the pristine channel material 1410, and the gate electrode 1412 disposed on the interfacial layer 1411. In an embodiment, the channel region 1407 has a width of about 2 nm to about 10 nm, and a height of about 40 nm to about 70 nm. In some embodiments, the doped 2D material layer 1408 has one to about 20 layers, and a thickness of about 0.5 nm to about 10 nm The thickness of about 0.5 nm indicates that the doped 2D material layer has a single layer of graphene, and the thicknesses of about 10 nm indicates that the doped 2D material layer has about 20 layers of graphene. In some embodiments, the pristine channel material has a thickness of about 2 nm and about 20 nm, and a width of about 5 nm to about 200 nm. It is understood that the number of channel regions 1407 on the substrate 1401 can be any integer number. In the example shown in FIG. 14F, three channel regions are used, but it is understood that the number is illustrative only and is chosen for describing the example embodiment and should not be limiting.

Figure 15:
FIG. 15 is a flowchart illustrating a method of manufacturing a semiconductor device according to some exemplary embodiments.

FIG. 15 is a flowchart illustrating a method 150 of manufacturing a semiconductor device according to some exemplary embodiments. It is understood that additional steps can be provided before, during, and after steps of method 150, and some of the steps can be replaced or eliminated for other embodiments of the method. The method 150 includes providing a substrate (step 1501). The substrate may be substantially similar to the substrate to the substrate 101, 401-1001 of FIGS. 1-10. The substrate may include an elementary semiconductor, a compound semiconductor, an insulator, or other suitable substrate materials. The method 150 also includes forming a pristine channel layer on the substrate. The pristine channel layer may include silicon (Si) or silicon germanium (SiGe) and may be formed by chemical vapor deposition (CVD). Other methods of forming a pristine layer of Si and SiGe will be apparent to those skilled in the art of semiconductor fabrication. The method 150 also includes forming a 2D material layer is on the pristine channel layer (step 1502). Thereafter, an ion implantation is carried out to dope impurities or dopants onto the 2D material layer. The dopants can be p-type dopants (e.g., B) or n-type dopants (e.g., N) (step 1503). The method 150 also includes performing a thermal treatment to thermally bond the doped 2D material layer to the pristine layer (step 1504). The thermal treatment is performed at a temperature ranging between about 400° C. to about 1200° C. The method 150 further includes performing an etch process to define a channel structure. The etch process may include forming a patterned mask layer on the doped 2D material layer and etching the doped 2D material layer, the pristine channel layer and a portion of the substrate using the patterned mask layer as a mask to form the channel structure (step 1505). The method 150 further includes forming an interfacial layer over the channel structure (step 1506). The method 150 also includes other fabrication processes (step 1507), such as forming a patterned gate electrode on the interfacial layer, forming source/drain regions in the substrate, forming an interlayer dielectric layer, forming through-holes extending through the interlayer dielectric layer, and filling the through-holes with a conductive material to form contacts that electrically coupled to the gate electrode, the source/drain regions.

Figure 16E:
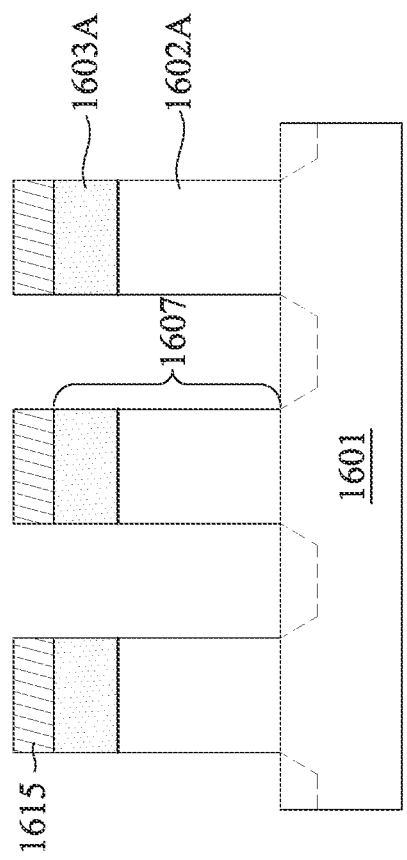

FIGS. 16A-16G are cross-sectional views illustrating intermediate steps of forming a portion of a semiconductor device 150 according to embodiments taken in a transversal direction across a channel structure, the transversal direction is perpendicular to a longitudinal direction across the channel region and the source/drain regions. FIGS. 16A-16G will be described together with reference to FIG. 15. Referring to FIG. 16A and step 1501, a substrate 1601 is provided. The substrate 1601 may be substantially similar to the substrate 101, 401-1001 shown and described with reference to FIGS. 1-10. Referring to FIG. 16B and step 1502, a pristine channel layer 1602 is formed on the substrate 1601, and a 2D material layer 1603 is formed on the pristine channel layer 1602 by chemical vapor deposition. In an embodiment, the substrate is a silicon substrate, and the pristine channel layer 1602 is epitaxially grown on the silicon substrate, i.e., the pristine channel layer includes silicon. In an embodiment, the substrate is a silicon substrate, and the pristine channel layer 1602 including silicon germanium (SiGe) is heteroepitaxially grown on the silicon substrate. In an embodiment, a pristine silicon layer including substantially pure silicon or pristine silicon germanium layer can be formed by atomic layer deposition (ALD) and chemical vapor deposition (CVD). The 2D material layer 1603 can include one or more layers of graphene or transition metal dichalcogenide, such as $MoS_2$, $MoSe_2$, $MoTe_2$, $WS_2$, and $WSe_2$. In an exemplary embodiment, a graphene layer can be formed by epitaxial graphene growth. For example, a silicon carbide dielectric is used as a seed layer to promote the epitaxial growth of the graphene on the pristine channel layer 1602. In another exemplary embodiment, a graphene layer can be formed by chemical vapor deposition directly on the pristine channel layer 1602. The 2D material layer 1603 may be doped by adding impurities to control mobility.

Figure 16D:
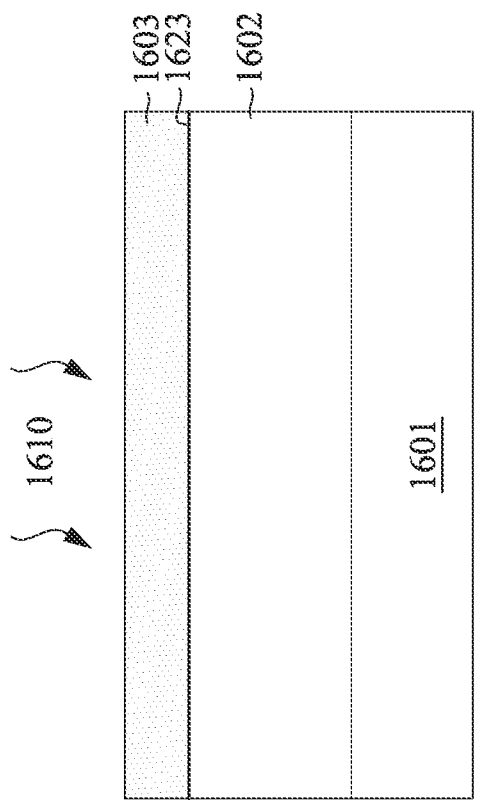

Referring to FIG. 16C and step 1503, an ion implantation 1609 is performed on the 2D material layer 1603. The ion implantation 1609 including N-type dopants (e.g., N) or P-type dopants (e.g., B) can be performed vertically and/or at an oblique angle with respect to the surface of the substrate 1601. The doped 2D material layer 1603 is indicated by a shaded box. In some embodiments, the ion implant process can adjust the implant energy, the dopant dose, and the implant temperature to vary the doping concentration along the thickness of the 2D material layer 1603. In some embodiments, the ion implant process also adjusts the implant parameters to provide a desired or target doping concentration profile to the 2D material layer 1603. Referring to FIG. 16D and step 1504, a thermal treatment 1610 is carried out to thermally bond the doped 2D material layer 1603 to the pristine channel layer 1602 (the bonding interface 1623 is shown as a thick line). In an embodiment, the thermal treatment 1610 is carried out at a temperature from about 400° C. to about 1200° C.

Referring to FIG. 16E and step 1505, an etching process is performed on the doped 2D material layer 1603 and the pristine channel layer 1602. In some embodiments, the etching process includes forming a photoresist layer 1615 over the doped 2D material layer 1603 and patterning it to expose portions of the doped 2D material layer 1603, and the pristine channel layer 1602 that are to be removed by an etchant. In an embodiment of FIG. 16E, the photoresist layer 1615 has been patterned to leave the photoresist material over the doped 2D material layer 1603. An exemplary photoresist layer 1615 includes a photosensitive material that causes the photoresist layer to undergo a property change when exposed to light. This property change can be used to selectively remove exposed or unexposed portions of the photoresist layer 1615. The etching process is then performed on the doped 2D material layer 1603 and the pristine channel layer 1602. The etching process may include any suitable etching process including dry etching, wet etching, and/or other etching methods, e.g., reactive ion etching (RIE). In some embodiments, the etching process includes multiple etching steps with different etchants, each targeting a particular material. Referring to FIG. 16E, the etching process selectively removes portions of the doped 2D material layer 1603 and the pristine channel layer 1602 to define one or more channel structures 1607. The channel structure 1607 includes a lower portion including a pristine channel region portion 1602A and a upper portion including a doped 2D material layer portion 1603A. In some embodiments, the etching process may removes a portion of the substrate 1601, as indicated by a dashed line. Thereafter, the patterned photoresist 1615 is removed.

Referring to FIG. 16F and step 1506, a conformal interfacial layer 1611 is blanket deposited on the pristine channel material layer and the exposed surface of the substrate. In some embodiments, the interfacial layer 1611 is formed by oxidation process, such as a thermal oxidation operation or a wet oxidation operation. In further embodiments, one or more dielectric materials are formed over the interfacial layer 1611. The conformal interfacial layer 1611 includes an insulating material to reduce a roughness at the interface between a subsequent formed gate electrode and the channel structure. Referring to FIG. 16G and step 1507, a conductive layer is formed on the interfacial layer 1611 to form a gate electrode 1612, an interlayer dielectric layer 1613 is formed on the gate electrode 1612, a planarizing process, e.g., a chemical mechanical polishing (CMP) process, is carried out to planarize the upper surface of the interlayer dielectric layer 1613. In an embodiment, the conductive layer can include one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, and/or combinations thereof. In some embodiments, the interfacial layer 1611 is selectively formed over a top surface of the doped 2D material layer portion 1603A and along sidewalls of the pristine channel region portion 1602A and 1603. In other words, a top surface of substrate 1601 between two adjacent fin structures is exposed to the gate electrode 1612. One of skill in the art will appreciate that other process steps can also be performed, and various alterations and modifications may be practiced. For example, source/drain regions can be formed in a gate-last process, an interlayer dielectric layer can be formed on the source/drain regions, through-holes can be formed extending through the interlayer dielectric layer, and the through-holes can be filled with a conductive material to form contacts that are electrically coupled to the gate electrode, the source/drain regions.

FIG. 16G is a cross-sectional view illustrating a channel structure 1600 according to an embodiment. The channel structure 1600 includes the channel region 1607 disposed on the substrate 1601, the channel region 1607 includes the lower portion including the pristine channel region portion 1602A and the upper portion including the doped 2D material layer portion 1603A. The channel structure 1600 also includes the interfacial layer 1611 disposed on the upper surface and sidewall surfaces of the doped 2D material layer portion 1603A, sidewall surfaces of the pristine channel region portion 1602A, and the exposed surface portion of the substrate 1601. The channel structure 1600 also includes the gate electrode 1612 disposed on the interfacial layer 1611. In an embodiment, the channel region 1607 has a width of about 5 nm to about 200 nm, and a height of about 40 nm to about 80 nm, the doped 2D material layer portion 1603A has one to about 60 layers, and a thickness of about 0.5 nm to about 30 nm. It is understood that the number of channel regions 1607 on the substrate 1601 can be any integer number. In the example shown in FIG. 16G, three channel regions are used, but it is understood that the number is illustrative only and is chosen for describing the example embodiment and should not be limiting.

Figures 16H, 16I:
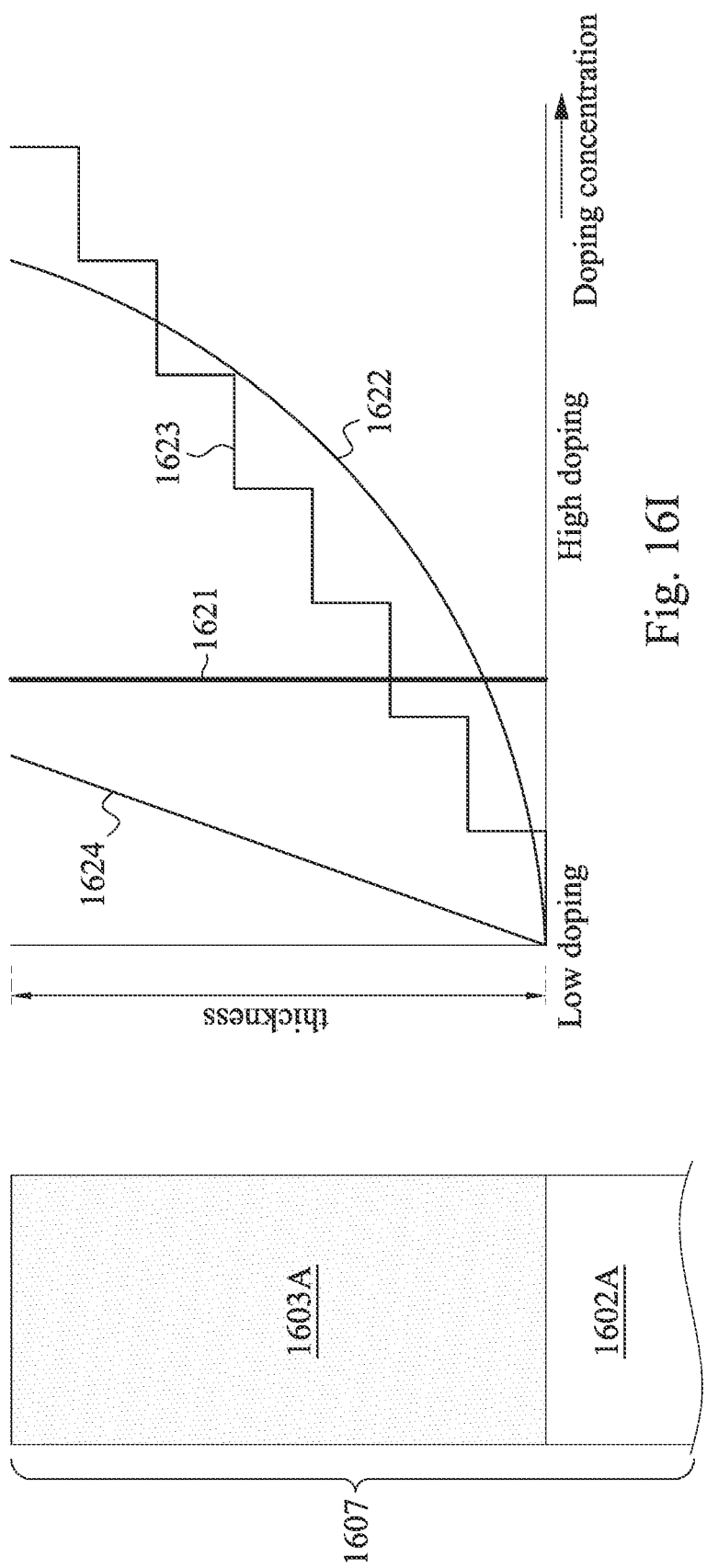
FIG. 16H is a cross-sectional view of an enlarged portion of a channel structure according to some exemplary embodiments.
FIG. 16I is a graph illustrating different doping concentration profiles across the thickness of a doped 2D material layer according to some embodiments.

FIG. 16H is a cross-sectional view of an enlarged portion of a channel structure 1607. FIG. 16I is a graph illustrating different doping concentration profile across the thickness of a doped 2D material layer according to some embodiments. The horizontal (x-axis) axis represents the doping concentration, and the vertical (y-axis) axis represents the thickness of the doped 2D material layer. In an embodiment, the doped 2D material layer has an approximate constant doping profile (indicated by line 1621) that is a target doping concentration across the thickness of the doped 2D material layer. In an embodiment, the doped 2D material layer has an exponential doping profile that increases across the thickness of doped 2D material layer, e.g., from the lower region to the upper region (indicated by line 1622). In an embodiment, the doped 2D material layer has a step-wise doping profile that increases across the thickness of doped 2D material layer, e.g., from the lower region to the upper region (indicated by line 1623). In an embodiment, the doped 2D material layer has a linear doping profile (indicated by line 1624) that increases across the thickness of doped 2D material layers. In some embodiments, the range of the doping concentration profile can increase by one, two, or three orders of magnitude across the thickness of the doped 2D material layer.

Figure 17:
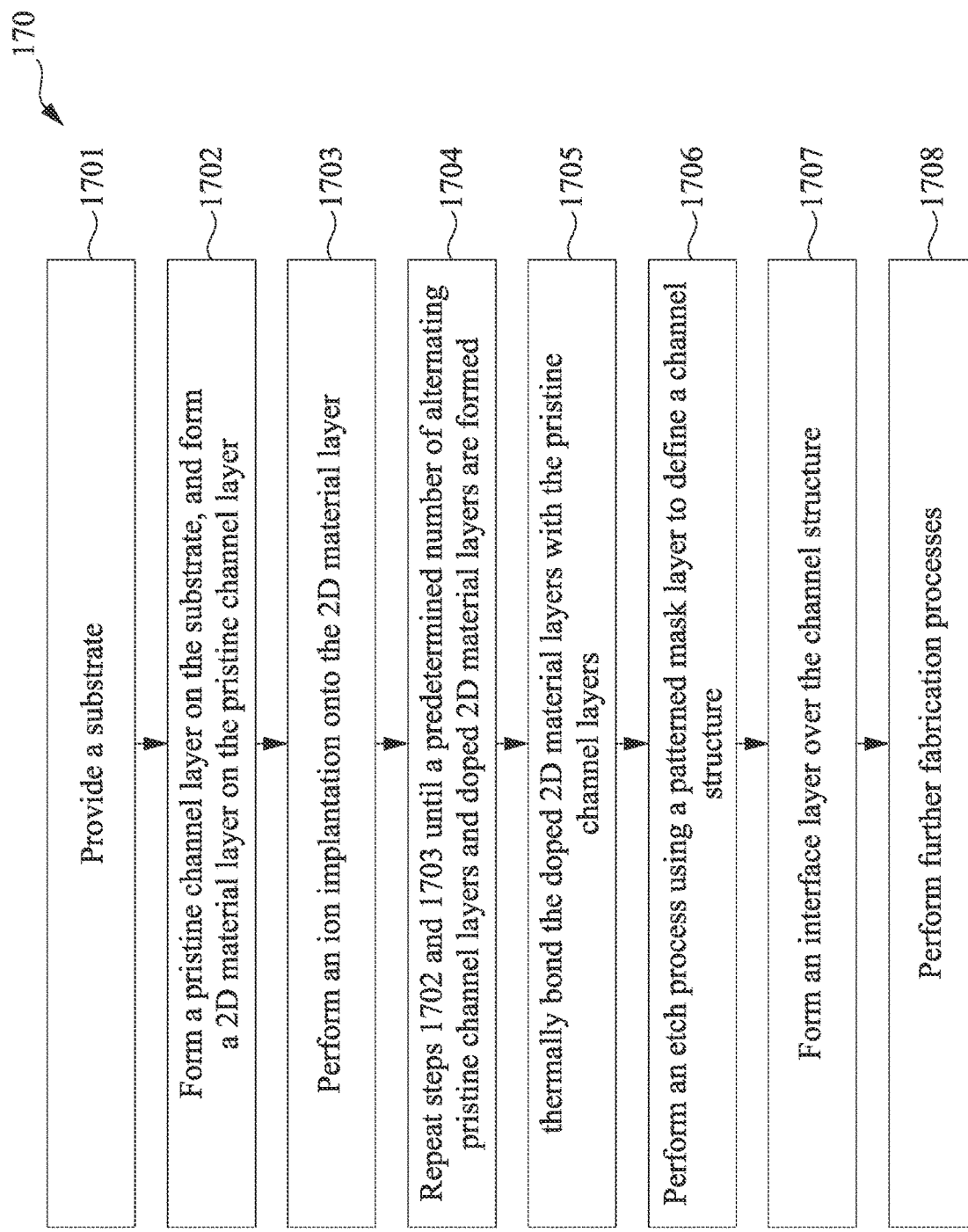
FIG. 17 is a flowchart illustrating a method of manufacturing a semiconductor device according to some exemplary embodiments.

FIG. 17 is a flowchart illustrating a method 170 of manufacturing a semiconductor device according to some exemplary embodiments. It is understood that additional steps can be provided before, during, and after steps of method 170, and some of the steps can be replaced or eliminated for other embodiments of the method. The method 170 includes providing a substrate (step 1701). The substrate may be substantially similar to the substrate to the substrate 101, 401-1001 of FIGS. 1-10. The substrate may include an elementary semiconductor, a compound semiconductor, an insulator, or other suitable substrate materials. The method 170 also includes forming a first pristine channel layer on the substrate. The first pristine channel layer may include silicon (Si) or silicon germanium (SiGe) and may be formed by chemical vapor deposition (CVD). Other methods of forming a pristine layer of Si and SiGe will be apparent to those skilled in the art of semiconductor fabrication. The method 170 also includes forming a 2D material layer is on the pristine channel layer (step 1702). Thereafter, an ion implantation is carried out to dope impurities or dopants onto the 2D material layer. The dopants can be p-type dopants (e.g., B) or n-type dopants (e.g., N) (step 1703). The method 170 also includes repeating steps 1702 and 1703 until a predetermined number of alternating pristine channel layers and doped 2D material layers are formed (step 1704). The method 170 also includes performing a thermal treatment to thermally bond the alternating doped 2D material layers and the pristine channel layers (step 1705). The thermal treatment is performed at a temperature ranging between about 400° C. to about 1200° C. The method 170 further includes performing an etch process to define a channel structure. The etch process may include forming a patterned mask layer on the top doped 2D material layer of the alternating doped 2D material layers and pristine channel layers and etching the alternating doped 2D material layers and the pristine channel layers using the patterned mask layer as a mask to form the channel structure (step 1706). The method 170 further includes forming an interfacial layer over the channel structure (step 1707). The method 170 also includes other fabrication processes (step 1708), such as forming a patterned gate electrode on the interfacial layer, forming source/drain regions in the substrate, forming an interlayer dielectric layer, forming through-holes extending through the interlayer dielectric layer, and filling the through-holes with a conductive material to form contacts that electrically coupled to the gate electrode, the source/drain regions.

Figure 18C:
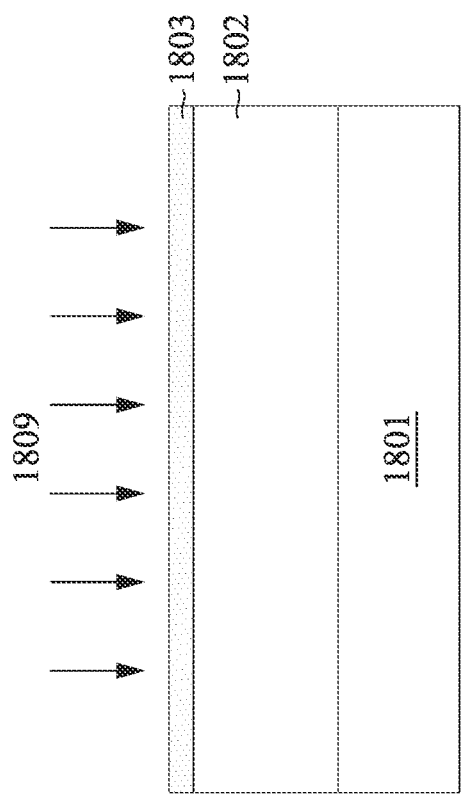

FIGS. 18A-18H are cross-sectional views illustrating intermediate steps of forming a portion of a semiconductor device according to embodiments taken in a transversal direction across a channel structure, the transversal direction is perpendicular to a longitudinal direction across the channel region and the source/drain regions. FIGS. 18A-18H will be described together with reference to FIG. 17. Referring to FIG. 18A and step 1701, a substrate 1801 is provided. The substrate 1801 may be substantially similar to the substrate 101, 401-1001 shown and described with reference to FIGS. 1-10. Referring to FIG. 18B and step 1702, a pristine channel layer 1802 is formed on the substrate 1801, and a 2D material layer 1803 is formed on the pristine channel layer 1802 by chemical vapor deposition. Referring to FIG. 18C and step 1703, an ion implantation 1809 is performed on the 2D material layer 1803. In some embodiments, the ion implant process can adjust the implant energy, the dopant dose, and the implant temperature to vary the doping concentration along the thickness of the 2D material layer 1803. In some embodiments, the ion implant process also adjusts the implant parameters to provide a desired or target doping concentration profile to the 2D material layer 1803. The steps 1702 and 1703 of forming the pristine channel layer 1802, the 2D material layer 1803, and doping the 2D material layer 1803 with impurities and FIGS. 18A to 18C are substantially the same as those of steps 1502 and 1503 and FIGS. 16A to 16C, respectively. Accordingly, they will not be described in detail herein for the sake of brevity.

Figure 18D:
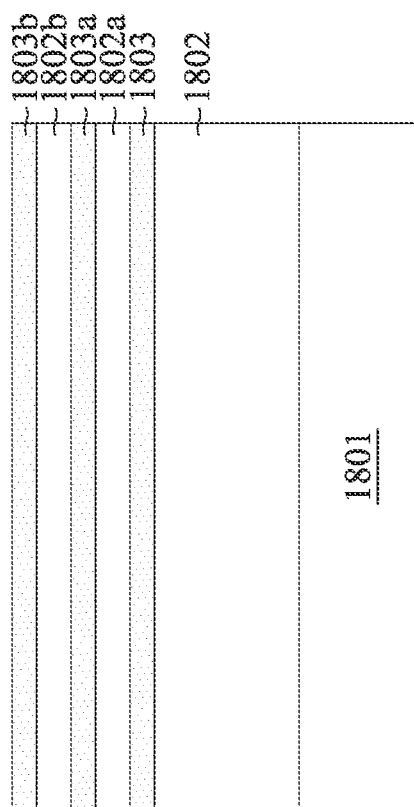

Referring to FIG. 18D and step 1704, a second pristine channel layer 1802a is formed on the doped 2D material layer 1803, and a second doped 2D material layer 1803a is formed on the second pristine channel layer 1802a. A third pristine channel layer 1802b is formed on the second doped 2D material layer 1803a, and a third doped 2D material layer 1803b is formed on the third pristine channel layer 1802b, and so forth until a predetermined number of alternating pristine channel layers and doped 2D material layers are formed.

Figure 18F:
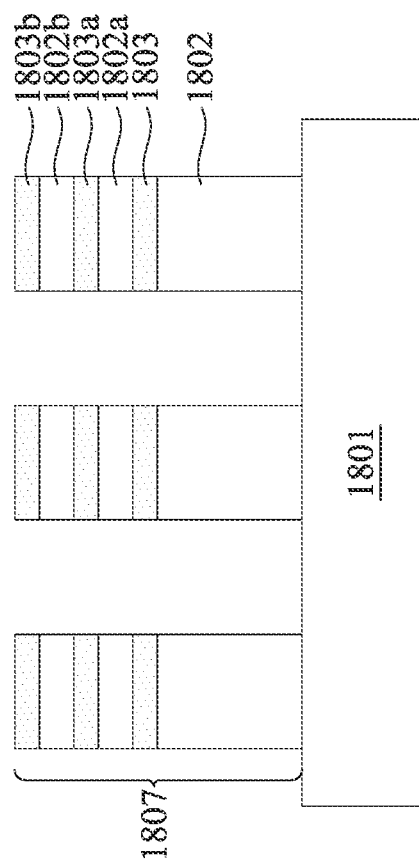
Figure 18E:
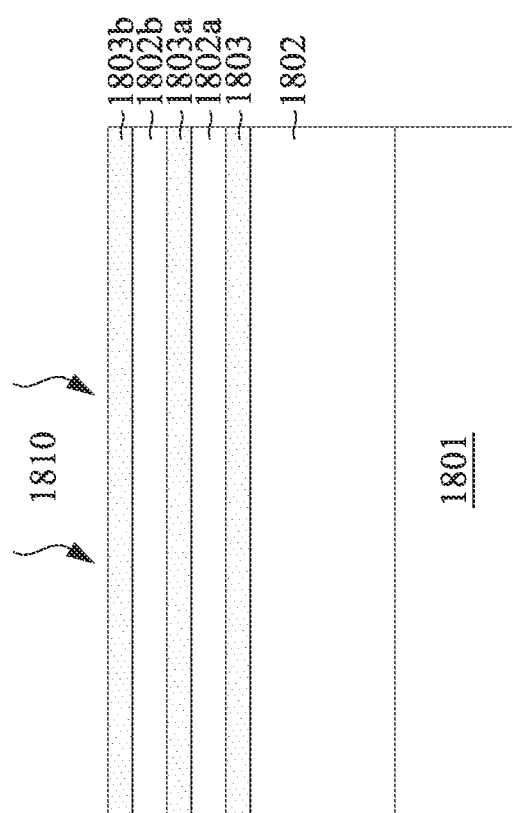

Referring to FIG. 18E and step 1705, a thermal treatment 1810 is carried out to thermally bond the alternating doped 2D material layers 1803 and the pristine channel layers 1802 together. In an embodiment, the thermal treatment 1810 is carried out at a temperature from about 400° C. to about 1200° C.

Referring to FIG. 18F and step 1706, an etching process is performed on the alternating doped 2D material layers and the pristine channel layers. In some embodiments, the etching process includes forming a photoresist layer (not shown) over the top doped 2D material layer 1603 and a patterned hard mask layer, e.g., SiN, (not shown)) on the photoresist layer, patterning the photoresist layer to expose portions of the top doped 2D material layer, and remove portions of the alternating stack of doped 2D material layers and pristine channel layers using the patterned hard mask as a mask to define a channel structure 1807. In some embodiments, the etch process may remove a portion of the substrate 1801, as indicated by a dotted line. The photoresist layer and the hard mask layer are then removed.

Referring to FIG. 18G and step 1707, a conformal interfacial layer 1811 is formed (e.g., blanket deposited) on the channel structure 1807 and the exposed surface of the substrate. The blanket interfacial layer 1811 includes an insulating material to reduce a roughness at the interface between a subsequent formed gate electrode and the channel structure. Referring to FIG. 18H and step 1708, a conductive layer is formed on the interfacial layer 1811 form a gate electrode 1812, an interlayer dielectric layer 1813 is formed over the gate electrode 1812, a planarizing process, e.g., a chemical mechanical polishing (CMP), is carried out to planarize the upper surface of the interlayer dielectric layer 1813. In an embodiment, the conductive layer can include one or more layers of any suitable material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, and/or combinations thereof. One of skill in the art will appreciate that other process steps can also be performed, and various alterations and modifications may be practiced. For example, source/drain regions can be formed in a gate-last process, an interlayer dielectric layer can be formed on the source/drain regions, through-holes can be formed extending through the interlayer dielectric layer, and the through-holes can be filled with a conductive material to form contacts that are electrically coupled to the gate electrode, the source/drain regions.

FIG. 18G is a cross-sectional view illustrating a channel structure 1800 according to an embodiment. The channel structure 1800 includes the channel region 1807 disposed on the substrate 1801, the channel region 1807 includes a stack of alternating layers of a plurality of pristine channel layers 1802 and a plurality of doped 2D material layers 1803. The channel structure 1800 also includes the interface 1811 disposed on the channel region 1807 and on the exposed surface portion of the substrate 1802. The channel structure 1800 also includes the gate electrode 1812 on the channel structure 1800. In an embodiment, the channel region 1807 has a width of about 5 nm to about 200 nm, and a height of about 40 nm to about 80 nm, each of the doped 2D material layers has one to about 60 layers, and a thickness of about 0.5 nm to about 30 nm. It is understood that the number of alternating layers of a plurality of pristine channel layers and a plurality of doped 2D material layers can have any integer number. In the example shown in FIG. 18H, a stack of three alternating pristine channel layers and doped 2D material layers are used, and three channel regions 1807 are shown, but it is understood that the number is illustrative only and is chosen for describing the example embodiment and should not be limiting. In other words, the number of the repeating sequences of pristine channel layers 1802 and doped 2D material layers 1803 are not limited to three, and may be as few as 1 and more than 3, e.g., 20, 40, or 60. By selecting the number of the stacked sequences, a driving current of a field effect transistor can be adjusting.

Figure 18J:
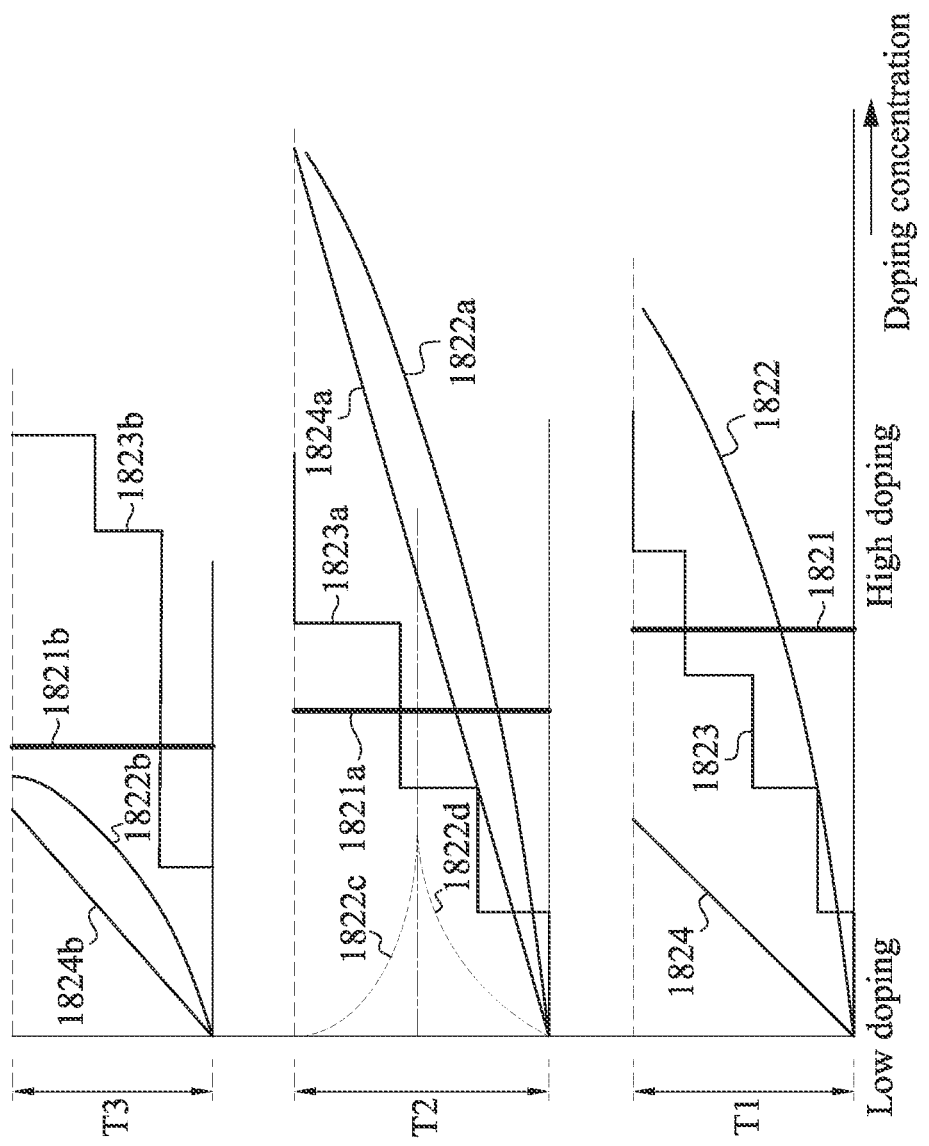
FIG. 18J is a graph illustrating different doping concentration profiles across the thickness of a doped 2D material layer in the channel structure of FIG. 18I.
Figure 18I:
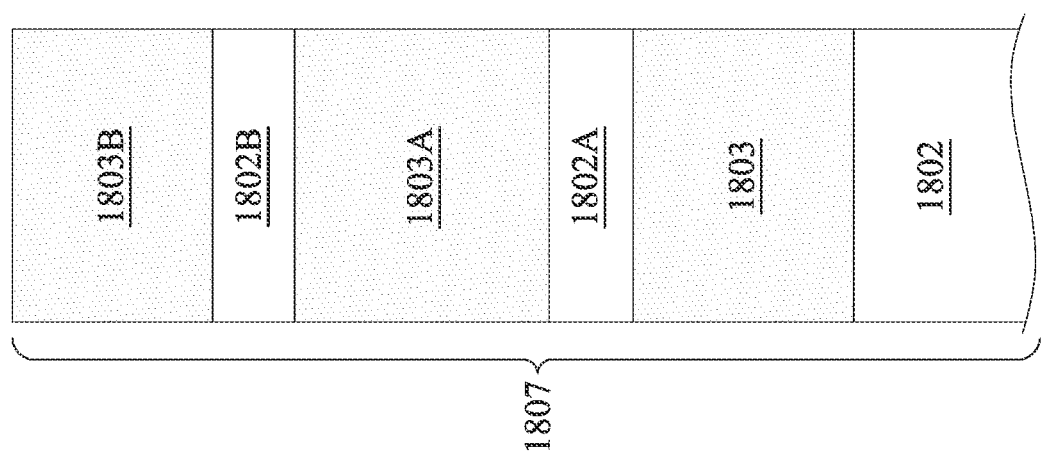
FIG. 18I is a cross-sectional view of an enlarged portion of a channel structure according to exemplary embodiments.

FIG. 18I is a cross-sectional view of an enlarged portion of a channel structure 1807. Referring to FIG. 18I, the channel structure 1807 includes a stack of alternating layers of a plurality of pristine channel layers 1802 and a plurality of doped 2D material layers 1803, e.g., a first pristine channel layer 1802, a first doped 2D material layer 1803 on the first pristine channel layer 1802, a second pristine channel layer 1802A on the first doped 2D material layer 1803, a second doped 2D material layer 1803A on the second pristine channel layer 1802A, a third pristine channel layer 1802B on the second doped 2D material layer 1803A, and a third doped 2D material layer 1803B on the third pristine channel layer 1802B. In one embodiment, the first doped 2D material layer 1803 has a first thickness T1, the second doped 2D material layer 1803A has a second thickness T2, and the third doped 2D material layer 1803B has a third thickness T3. The first, second, and third thicknesses may have the same thickness or different thicknesses.

FIG. 18J is a graph illustrating different doping concentration profile across the thickness of a doped 2D material layer in the channel structure 1807 according to some embodiments. The horizontal (x-axis) axis represents the doping concentration, and the vertical (y-axis) axis represents the thickness of the doped 2D material layers. In an embodiment, each of the doped 2D material layers 1803, 1803A, and 1803B has an approximate constant doping profile (indicated by line 1821, 1821a, and 1821b, respectively) that is a target doping concentration across the thickness of the doped 2D material layers. In an embodiment, each of the doped 2D material layers has an exponential doping profile that increases across the thickness of doped 2D material layers, e.g., from the lower region to the upper region (indicated by line 1822, 1822a, and 1822b, respectively). In an embodiment, each of the doped 2D material layers has a step-wise doping profile that increases across the thickness of doped 2D material layers, e.g., from the lower region to the upper region (indicated by line 1823, 1823a, and 1823b, respectively). In an embodiment, one or more of the doped 2D material layers has a doping profile that decreases from the middle region to the peripheral regions, as indicated by lines 1822c, 1822d. In certain embodiments, each of the doped 2D material layers has a linear doping profile (indicated by lines 1824, 1824a, 1824b) that increases across the thickness of doped 2D material layers. In some embodiments, the range of the doping concentration profile can increase by one, two, or three orders of magnitude across the thickness of the doped 2D material layer.

Figure 19:
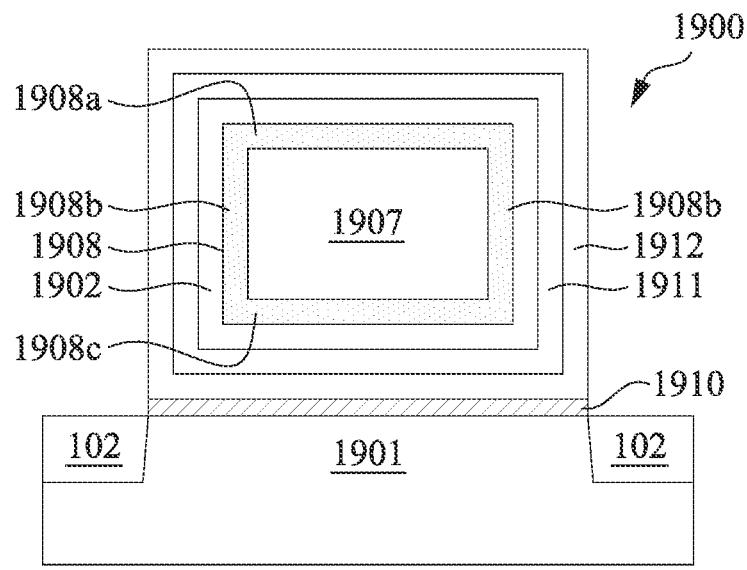
FIG. 19 shows a channel structure according to an embodiment.

FIG. 19 shows a channel structure 1900 according to an embodiment. The channel structure 1900 is formed over a substrate 1901. FIG. 19 is a cross-sectional view taken along line A-A of FIG. 3A. FIG. 19 is similar to FIG. 3B except for the differences described herein. In some embodiments, the channel structure 1900 includes a channel region 1907 including a doped 2D material layer 1908 surrounding the channel region 1907, a semiconductor layer 1902 surrounding the doped 2D material layer 1908, an interfacial layer 1911 of a dielectric material surrounding the pristine semiconductor layer 1902, and a gate electrode 1912 surrounding the interfacial layer 1911. In an embodiment, the semiconductor layer 1902 includes a pristine channel material.

In an embodiment, the substrate 1901 includes a trench isolation structure 102, e.g., a shallow trench isolation (STI) region, in the substrate, and a gate dielectric layer 1910 disposed between a portion of the main surface of the substrate and the gate electrode 1912. The gate dielectric layer 1910 includes one or more layers of a dielectric material, such as silicon oxide, silicon nitride, or high-k dielectric material, or combinations thereof. In an embodiment, the substrate 1901 includes an elementary semiconductor, e.g., silicon, germanium, a compound semiconductor including silicon carbide, gallium arsenide, gallium phosphide, an alloy semiconductor, such as silicon germanium, gallium arsenic phosphide, a silicon-on-insulator structure, or a combination thereof. In some embodiments, the substrate 1901 can be doped with p-type dopants (e.g., boron, indium, aluminum, or gallium) or n-type dopants (e.g., phosphorous or arsenic). The channel region 2007 may have the same material or different materials than the substrate 2001. In an embodiment, the doped 2D material layer 1908 includes one or more doped layers of graphene. The graphene layer has a very small thickness of 0.5 nm. In an embodiment, the doped 2D material layer includes or one or more doped sub-layers of transition metal dichalcogenide (TMD) material. The TMD material may include a compound of transition metal atoms (Mo, W, Ti, or the like), and chalcogen atoms (S, Se, Te, or the like). A sublayer of the TMD material has a very small thickness. For example, a $MoS_2$ monolayer has a thickness of about 0.65 nm. In some embodiments, the doped 2D material layer 1908 may include one or more sub-layers of $MoS_2$, $WS_2$, $MoSe_2$, $MoTe_2$, and combinations thereof.

The interfacial layer 1911 includes one or more layers of a dielectric material, such as silicon oxide, silicon nitride, or high-k dielectric material, and/or combinations thereof. Examples of high-k dielectric material include $HfO_2$, HfO-SiO, HfSiON, zirconium oxide, aluminum oxide, titanium oxide, or combination thereof. The gate electrode 1912 includes polysilicon, carbon material, metal, metal alloy, or combinations thereof.

In some embodiments, the channel region 1907 has a length in a range from about 2 nm to about 100 nm and a height in a range from about 2 nm to about 80 nm. The doped 2D material layer 1908 has a thickness in a range from about 0.5 nm to about 10 nm. The pristine semiconductor layer 1902 has a thickness in a range from about 2 nm to about 20 nm.

Figure 20:
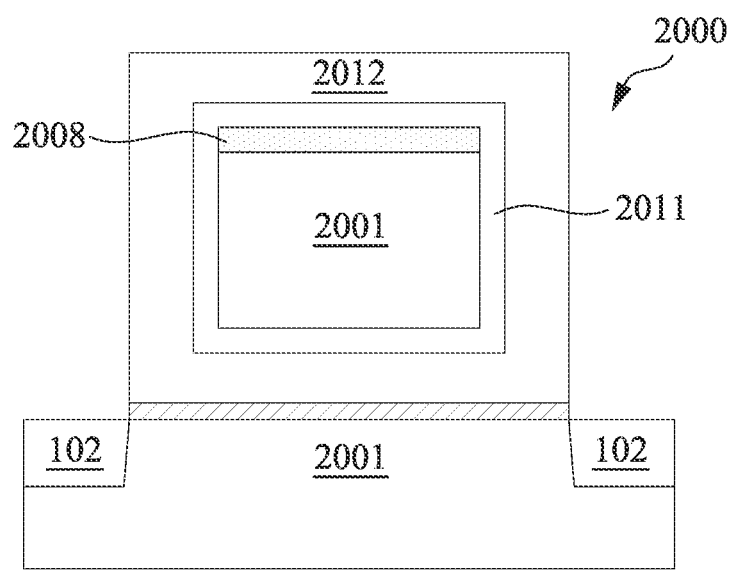
FIG. 20 shows a channel structure according to another embodiment.

FIG. 20 shows a channel structure 2000 according to an embodiment. The channel structure 2000 is formed over a substrate 2001. FIG. 20 is a cross-sectional taken along line A-A of FIG. 3A. FIG. 20 is similar to FIG. 3B except for the differences described herein. In some embodiments, the channel structure 2000 includes a channel region 2007, a doped 2D material layer 2008 disposed on an upper surface of the channel region 2007, an interfacial layer 2011 of a dielectric material surrounding (wrapping around) the channel region 2007 including the doped 2D material layer 2008, and a gate electrode 2012 surrounding the interfacial layer 2011.

In an embodiment, the substrate 2001 includes a trench isolation structure 102, e.g., a shallow trench isolation (STI) region in the substrate, and a gate dielectric layer 2010 disposed between a portion of its main surface and the gate electrode 2012. In an embodiment, the substrate 2001 includes an elementary semiconductor, e.g., silicon, germanium, a compound semiconductor including silicon carbide, allium arsenide, gallium phosphide, an alloy semiconductor, such as silicon germanium, gallium arsenic phosphide, a silicon-on-insulator structure, or a combination thereof. In some embodiments, the substrate 2001 can be doped with p-type dopants (e.g., boron, indium, aluminum, or gallium) or n-type dopants (e.g., phosphorous or arsenic). The channel region 2007 may have the same material or different materials than the substrate 2001. In an embodiment, the doped 2D material layer 2008 can include one or more doped layers of graphene. In an embodiment, the doped 2D material layer can include or one or more doped sub-layers of transition metal dichalcogenide (TMD) material. The TMD material may include a compound of transition metal atoms (Mo, W, Ti, or the like), and chalcogen atoms (S, Se, Te, or the like). A sublayer of the TMD material has a very small thickness. For example a $MoS_2$ monolayer has a thickness of about 0.65 nm. In some embodiments, the doped 2D material layer 2008 may include one or more sub-layers of $MoS_2$, $WS_2$, $MoSe_2$, $MoTe_2$, and combinations thereof.

In some embodiments, the channel region 2007 has a length in a range from about 2 nm to about 120 nm and a height in a range from about 2 nm to about 100 nm. The doped 2D material layer 2008 has a thickness in a range from about 0.5 nm to about 30 nm.

In some embodiments, the doped 2D material layer 2008 has a constant doping profile with dopant concentrations in a range from about 1E19 ($10^{19}$) atoms/cm$^3$ to 1E22 ($10^{22}$) atoms/cm$^3$. In some embodiments, the doped 2D material layer 2008 has a non-constant doping profile, e.g., a graded doping profile with a linear or exponential doping concentration in a range from 1E19 atoms/cm$^3$ to 1E22 atoms/cm$^3$ that increases from the lower surface (bottom region) to the upper surface (top region) of the doped 2D material layer 2008. In an embodiment, doped 2D material layer 2008 has a step-wise doping concentration profile that increases from the lower surface (bottom region) to the upper surface (top region). As used herein, a constant doping profile refers to a material layer that has an approximate constant concentration of dopant across the thickness of the material layer. A linear doping profile refers to a material layer that linearly increases across the thickness of the material layer. An exponential doping profile refers to a material layer that exponentially increases across the thickness of the material layer.

Figure 21:
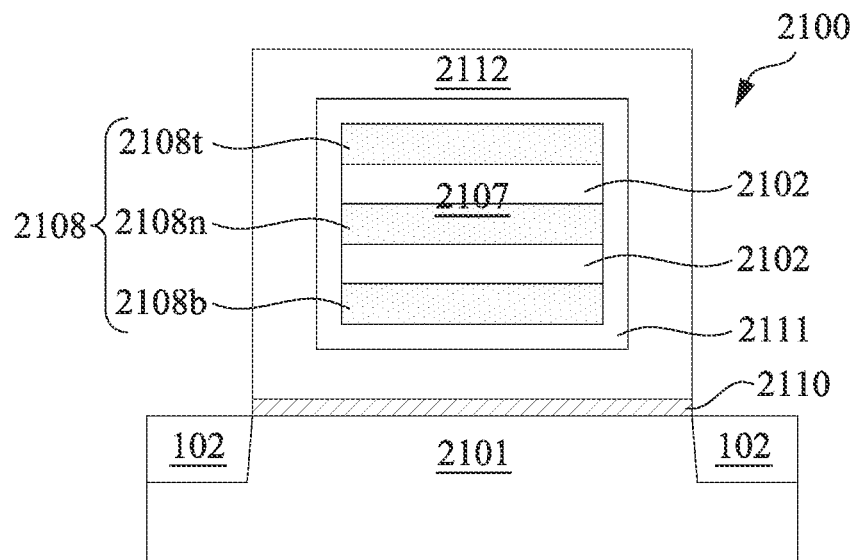
FIG. 21 shows a channel structure according to yet another embodiment.

FIG. 21 shows a channel structure 2100 according to an embodiment. The channel structure 2100 is formed over a substrate 2101. FIG. 21 is a cross-sectional taken along line A-A of FIG. 3A. FIG. 21 is similar to FIG. 3B except for the differences described herein. In some embodiments, the channel structure 2100 includes a channel region 2107 having a stack 2108 of a plurality of alternating layers 2108n of doped 2D material sublayers 2108 and pristine semiconductor layers 2102. In some embodiments, the plurality of alternating layers includes two to 80 alternating layers with a top layer being a doped 2D material sublayer 2108t and a bottom being a doped 2D material sublayer 2108b. The channel structure 2100 further includes an interfacial layer 2111 of a dielectric material surrounding (wrapping around) the channel region 2107 including the doped 2D material layer 2108, and a gate electrode 2112 surrounding the interfacial layer 2111.

In an embodiment, the substrate 2101 includes a trench isolation structure 102, e.g., a shallow trench isolation (STI) region in the substrate, and a gate dielectric layer 2110 disposed between a portion of its main surface and the gate electrode 2112. In an embodiment, the substrate 2101 includes an elementary semiconductor, e.g., silicon, germanium, a compound semiconductor including silicon carbide, allium arsenide, gallium phosphide, an alloy semiconductor, such as silicon germanium, gallium arsenic phosphide, a silicon-on-insulator structure, or a combination thereof. In some embodiments, the substrate 1901 can be doped with p-type dopants (e.g., boron, indium, aluminum, or gallium) or n-type dopants (e.g., phosphorous or arsenic). The channel region 2107 may have the same material or different materials than the substrate 2101. In an embodiment, the doped 2D material layer 2108 can include one or more doped layers of graphene. In an embodiment, the doped 2D material layer can include or one or more doped sub-layers of transition metal dichalcogenide (TMD) material. The TMD material may include a compound of transition metal atoms (Mo, W, Ti, or the like), and chalcogen atoms (S, Se, Te, or the like). A sublayer of the TMD material has a very small thickness. For example a MoS2 monolayer has a thickness of about 0.65 nm. In some embodiments, the doped 2D material layer 2108 may include one or more sub-layers of $MoS_2$, $WS_2$, $MoSe_2$, $MoTe_2$, and combinations thereof.

In some embodiments, the channel region 2107 has a length in a range from about 2 nm to about 120 nm and a height in a range from about 2 nm to about 100 nm. Each doped 2D material sublayer of the doped 2D material layer 2108 has a thickness in a range from about 0.5 nm to about 30 nm.

In some embodiments, each sublayer of the doped 2D material layer 2108 has a constant doping profile that is substantially constant across the thickness of the sublayer. In an embodiment, the constant doping profile has dopant concentrations that varies less than 10 percent of a constant doping concentration ranging from about 1E19 ($10^{19}$) atoms/$cm^3$ to 1E22 ($10^{19}$) atoms/$cm^3$. In other embodiments, each sublayer of the doped 2D material layer 2008 has a non-constant doping profile, e.g., a graded doping profile with a linear or exponential doping concentration that decreases from the middle portion of the sublayer toward its upper surface (top region) and lower surface (bottom region), the top sublayer 2108$t$ has a doping concentration that decreases from the upper region to the lower region, and the bottom sublayer 2108$b$ has a doping concentration that increases from the lower region to the upper region.

Figure 22:
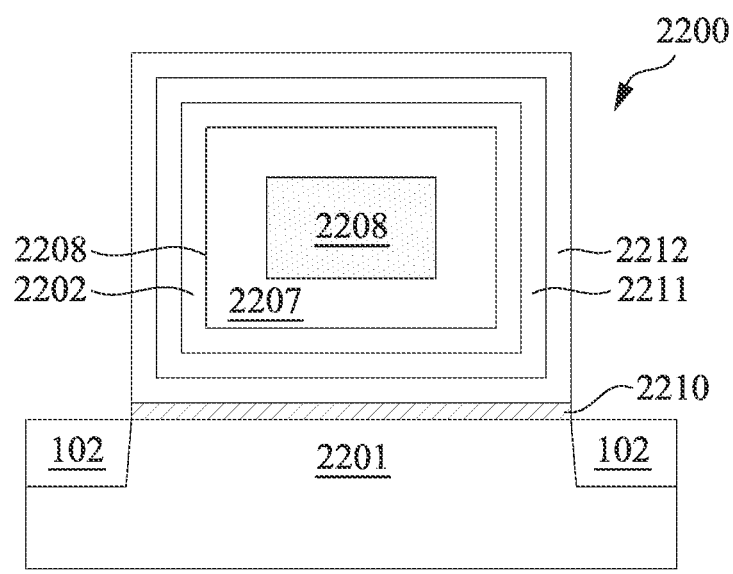
FIG. 22 shows a channel structure according to still another embodiment.

FIG. 22 shows a channel structure 2200 according to an embodiment. The channel structure 2200 is formed over a substrate 2201. FIG. 22 is a cross-sectional taken along line A-A of FIG. 3A. FIG. 22 is similar to FIG. 3B except for the differences described herein. In some embodiments, the channel structure 2200 includes a channel region 2207 having a doped 2D material layer 2208 disposed in its center region, a pristine material layer 2202 surrounding the channel region 2207, an interfacial layer 2211 of a dielectric material surrounding (wrapping around) the pristine material layer 2202, and a gate electrode 2212 surrounding the interfacial layer 2211.

In an embodiment, the substrate 2201 includes a trench isolation structure 102, e.g., a shallow trench isolation (STI) region in the substrate, and a gate dielectric layer 2210 disposed between a portion of its main surface and the gate electrode 2212. In an embodiment, the substrate 2201 includes an elementary semiconductor, e.g., silicon, germanium, a compound semiconductor including silicon carbide, allium arsenide, gallium phosphide, an alloy semiconductor, such as silicon germanium, gallium arsenic phosphide, a silicon-on-insulator structure, or a combination thereof. In some embodiments, the substrate 2201 can be doped with p-type dopants (e.g., boron (B), indium (In), aluminum (Al), or gallium (Ga)) or n-type dopants (e.g., nitrogen (N), phosphorous (P), sulfur (S), or arsenic (As)). The channel region 2207 may have the same material or different materials than the substrate 2201. In an embodiment, the doped 2D material layer 2208 can include one or more doped layers of graphene. In an embodiment, the doped 2D material layer can include or one or more doped sub-layers of transition metal dichalcogenide (TMD) material. The TMD material may include a compound of transition metal atoms (Mo, W, Ti, or the like), and chalcogen atoms (S, Se, Te, or the like). A sublayer of the TMD material has a very small thickness. For example a MoS2 monolayer has a thickness of about 0.65 nm. In some embodiments, the doped 2D material layer 2208 may include one or more sub-layers of $MoS_2$, $WS_2$, $MoSe_2$, $MoTe_2$, and combinations thereof.

In some embodiments, the channel region 2207 has a length in a range from about 2 nm to about 100 nm and a thickness in a range from about 2 nm to about 20 nm. The doped 2D material layer 2208 has a thickness in a range from about 2 nm to about 50 nm. In some embodiments, the doped 2D material layer 2208 has a constant doping profile with dopant concentrations in a range from about 1E19 ($10^{19}$) atoms/cm 3 to 1E22 ($10^{22}$) atoms/$cm^3$.

Figure 23:
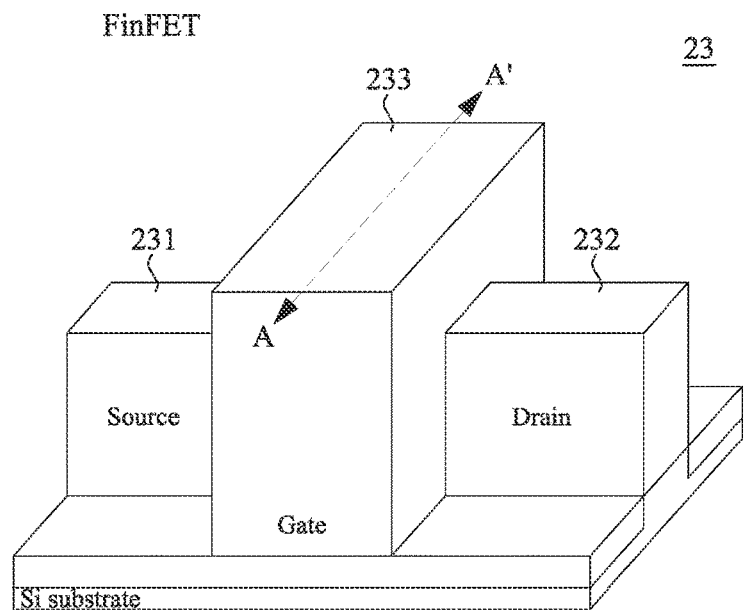
FIG. 23 is a perspective view illustrating a fin-type semiconductor device according to an embodiment.

FIG. 23 is a perspective view illustrating a fin-type semiconductor device 23 according to an embodiment. The semiconductor device 23 includes a fin-type semiconductor structure having a source region 231, a drain region 232, a channel region disposed between the source and drain regions 231, 232, and a gate electrode 233 disposed on the channel region.

Figures 24, 25:
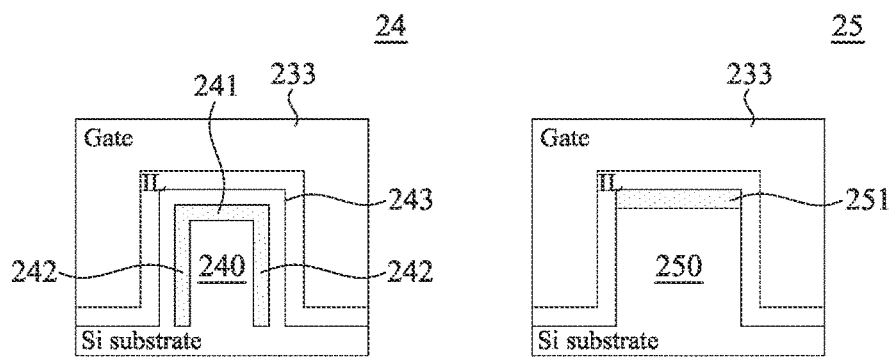
FIGS. 24-27 are cross-sectional views illustrating channel regions including a doped 2D material layer according to some embodiments.

FIG. 24 is a cross-sectional view illustrating a fin-type semiconductor device 24 comprising a channel region 240 including a doped 2D material layer (shaded area) having an upper surface portion 241 on an upper surface of the channel region, and side surface portions 242 disposed on sidewall surfaces of the channel region according an embodiment. The semiconductor device 24 also includes a semiconductor layer 243 on the doped 2D material layer, an interfacial layer IL on the semiconductor layer, and a gate electrode Gate on the interfacial layer IL. In an embodiment, the semiconductor layer 243 is a pristine semiconductor layer.

FIG. 25 is a cross-sectional view illustrating a fin-type semiconductor device 25 comprising a channel region 250 including a doped 2D material layer (shaded area) 251 on an upper surface of the channel region, an interfacial layer IL on the doped 2D material layer and sidewall surfaces of the channel region, and a gate electrode Gate on the interfacial layer IL according an embodiment.

Figures 26, 27:
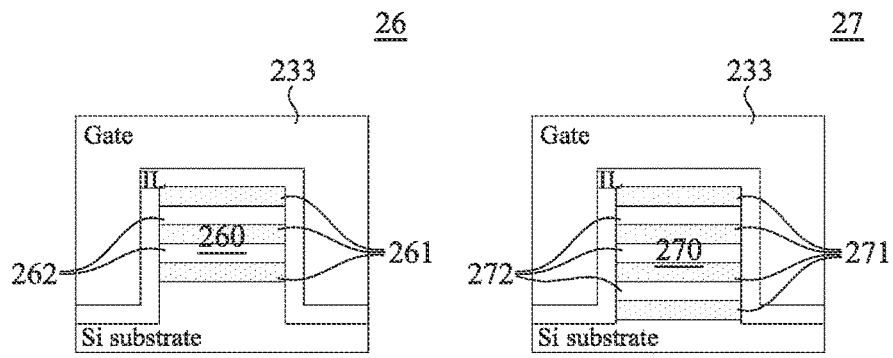

FIG. 26 is a cross-sectional view illustrating a fin-type semiconductor device 26 comprising a channel region 260 including a stack of alternating doped 2D material layers (shaded area) 261 and semiconductor layers 262 on the silicon substrate, an interfacial layer IL on the stack of alternating doped 2D material layers and semiconductor layers, and a gate electrode Gate on the interfacial layer IL according an embodiment. In an embodiment, the semiconductor layers 262 are pristine semiconductor layers.

FIG. 27 is a cross-sectional view illustrating a fin-type semiconductor device 27 comprising a channel region 270 including a stack of alternating doped 2D material layers (shaded area) 271 and semiconductor layers 272 on the silicon substrate, an interfacial layer IL on the stack of alternating doped 2D material layers and pristine semiconductor layers, and a gate electrode Gate on the interfacial layer IL according an embodiment. The stack configuration is similar to that of FIG. 26 except that the bottom layer is a doped 2D material layer on the silicon substrate. In an embodiment, the semiconductor layers 362 are pristine semiconductor layers.

Figure 28:
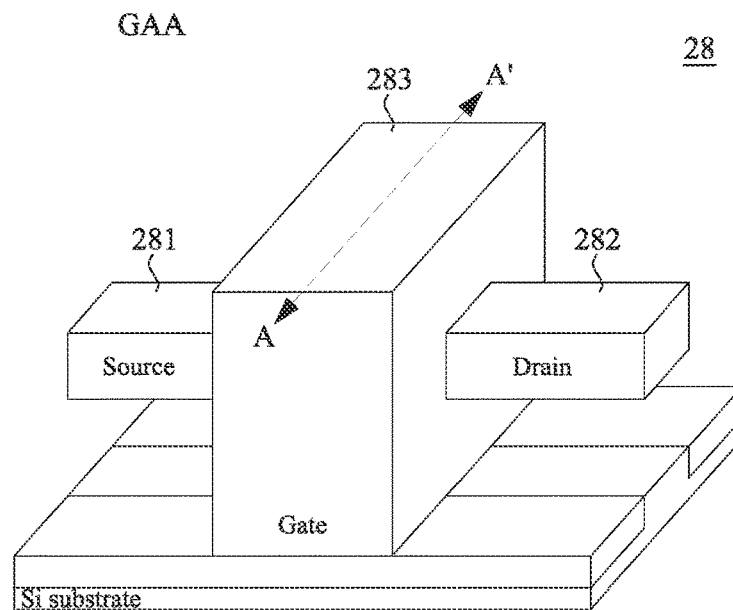
FIG. 28 is a perspective view illustrating a gate-all-around (GAA) semiconductor device according to an embodiment.

FIG. 28 is a perspective view illustrating a semiconductor device 28 according to an embodiment. The semiconductor device 28 includes a gate-all-around (GAA) semiconductor structure having a source region 281, a drain region 282, a channel region disposed between the source and drain regions, and a gate electrode 283 surrounding the channel region.

Figures 29, 30:
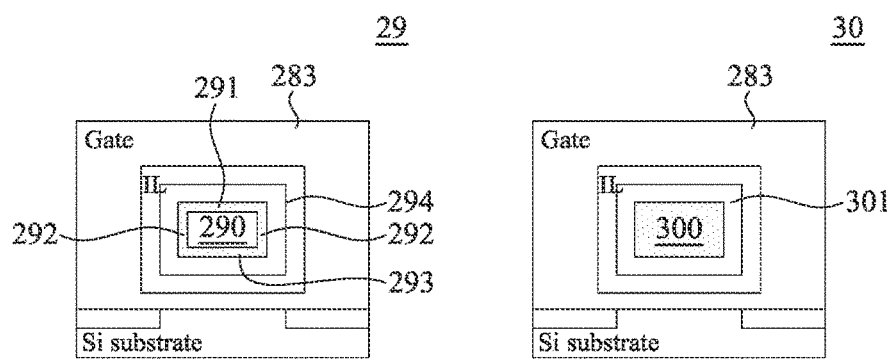
FIGS. 29-32 are cross-sectional views illustrating a channel region including a doped 2D material layer according to some embodiments.

FIG. 29 is a cross-sectional view illustrating a GAA semiconductor device 29 comprising a channel region 290 including a doped 2D material layer (shaded area) having an upper surface portion 291 on a top surface of the channel region, side surface portions 292 disposed on sidewall surfaces of the channel region, and a lower surface portion 293 on a bottom surface of the channel region according an embodiment. The semiconductor device 29 also includes a semiconductor layer 294 on the doped 2D material layer, an interfacial layer IL on the semiconductor layer, and a gate electrode Gate on the interfacial layer IL. In an embodiment, the semiconductor layer 294 is a pristine semiconductor layer.

FIG. 30 is a cross-sectional view illustrating a GAA semiconductor device comprising a channel region including a doped 2D material layer (shaded area) 300 in the channel region, a semiconductor material layer 301 surrounding the doped 2D material layer, an interfacial layer IL surrounding the doped 2D material layer, and a gate electrode Gate surrounding the interfacial layer IL according an embodiment. In an embodiment, the semiconductor material layer 301 is a pristine semiconductor layer.

Figures 31, 32:
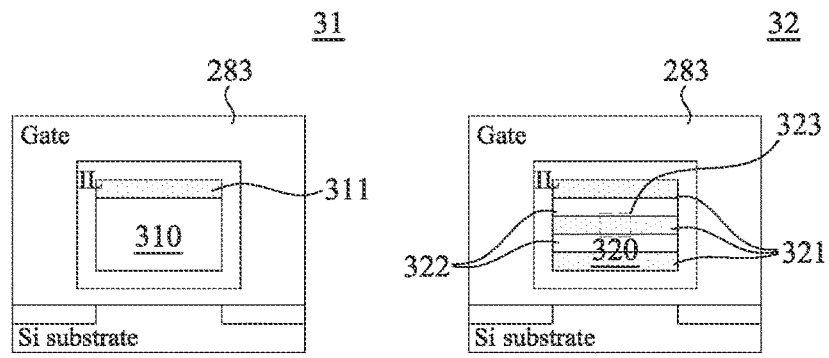

FIG. 31 is a cross-sectional view illustrating a GAA semiconductor device 31 comprising a channel region 310 including a doped 2D material layer (shaded area) 311 on an upper surface of the channel region, an interfacial layer IL surrounding the channel region including the doped 2D material layer, and a gate electrode Gate surrounding the interfacial layer IL according an embodiment.

FIG. 32 is a cross-sectional view illustrating a GAA semiconductor device 32 comprising a channel region 320 including a stack of alternating doped 2D material layers (shaded area) 321 and semiconductor layers 322 on the silicon substrate, an interfacial layer IL on the stack of alternating doped 2D material layers and semiconductor layers, and a gate electrode Gate on the interfacial layer IL according an embodiment. In an embodiment, the semiconductor layers 322 are pristine semiconductor layers. The dotted line box 323 represents a portion of the doped material layer and indicates that the doped 2D material layer may include one or more monolayers of doped graphene or one or more monolayers of doped $MoS_2$, $WS_2$, $MoSe_2$, $MoTe_2$, and combinations thereof. The dotted line box 323 can be a portion of a doped material layer or the entire doped material layer.

Figure 33:
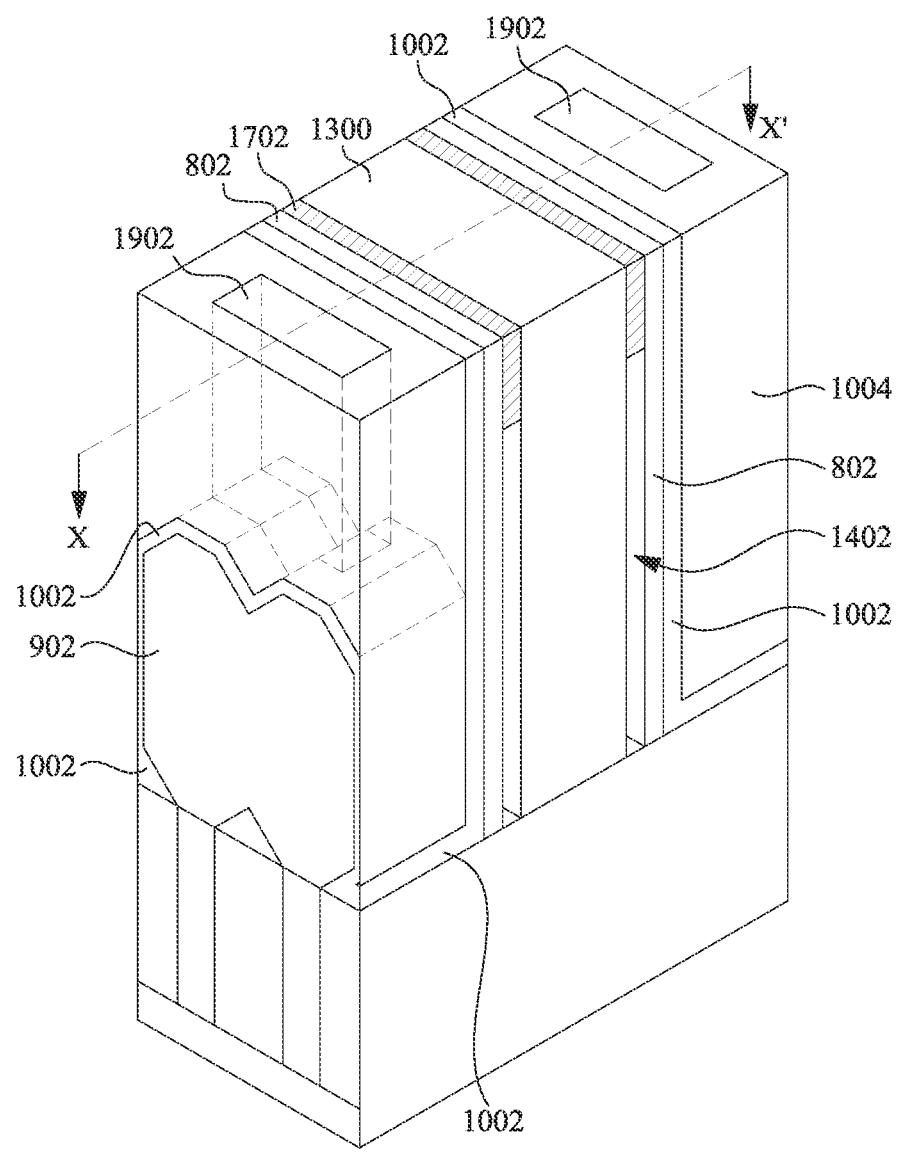
FIG. 33 is a perspective view of a multi-gate and multiple stacked channel device according to an embodiment.
Figure 34:
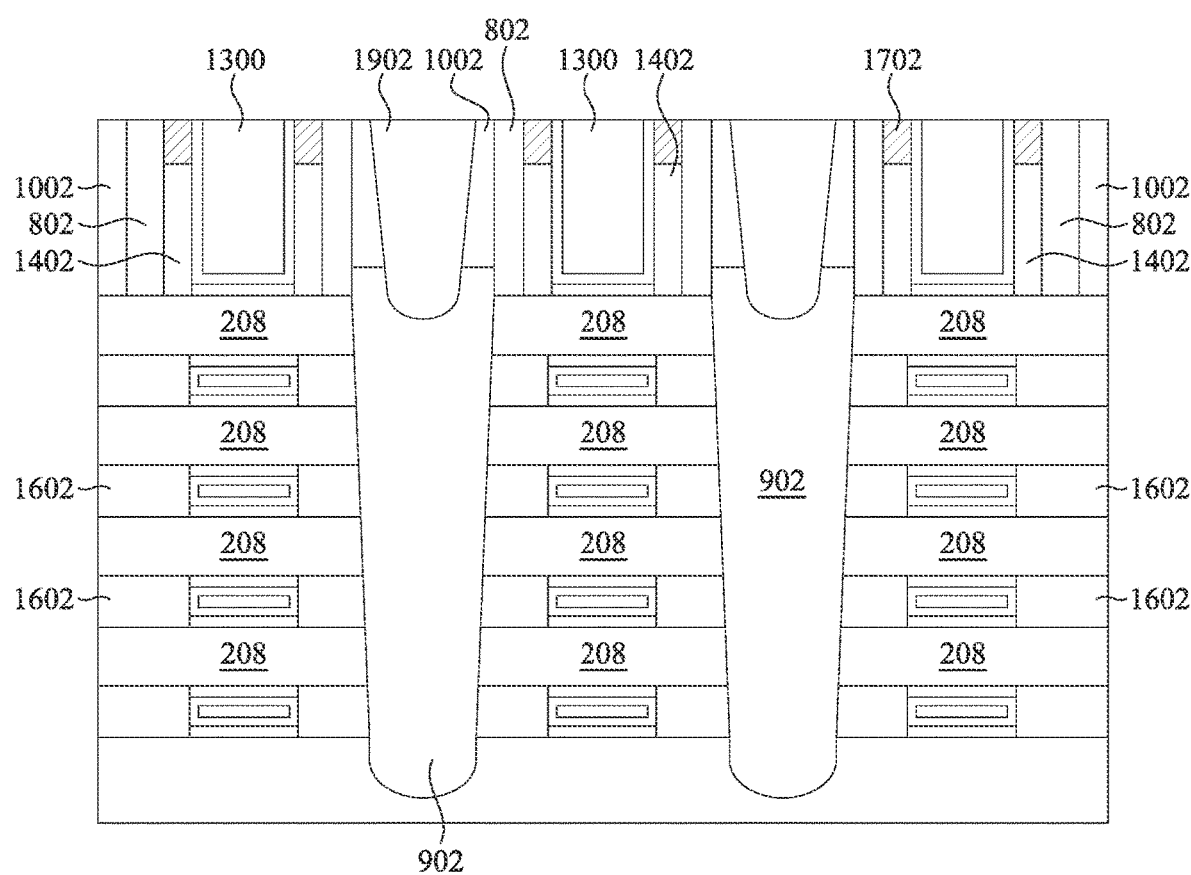
FIG. 34 is a cross-sectional view of the device 33 according to an embodiment along the line X-X'.
Figure 35:
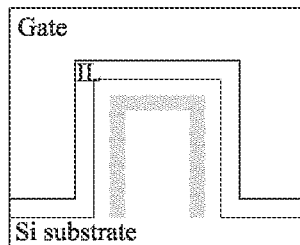
FIGS. 35-42 are cross-sectional views illustrating a channel region including a doped 2D material layer according to some embodiments.
Figure 36:
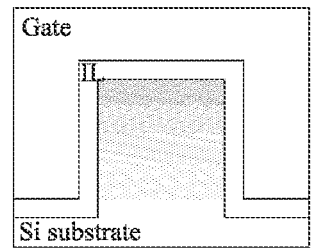
Figure 37:
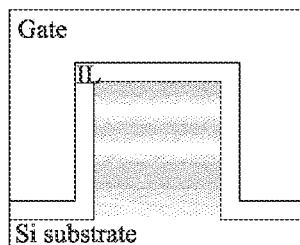
Figure 38:
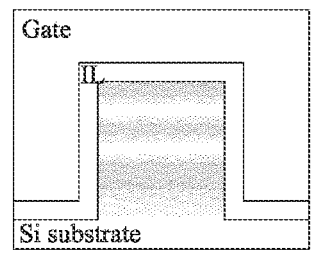
Figure 39:
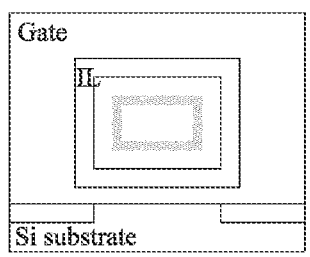
Figure 40:
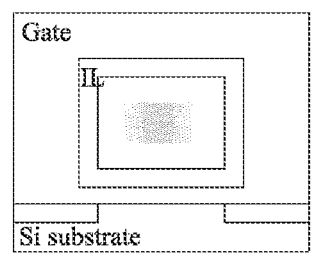
Figure 41:
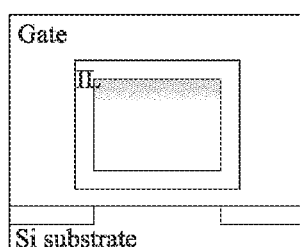
Figure 42:
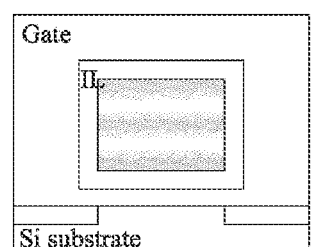

FIG. 33 is a perspective view of a multi-gate and multiple stacked channel device 33 according to an embodiment. FIG. 34 is a cross-sectional view of the device 33 according to an embodiment along the line X-X'. Referring to FIG. 33 and FIG. 34, the multi-gate and multiple stacked channel device 33 includes a substrate 3301, a shallow trench isolation structure 3302 on the substrate 3301, a gate structure 1300 disposed between source/drain regions 902 and surrounding multiple stacked channel regions 208 disposed between the source/drain regions 902, an opening 1402 adjacent the gate structure 1300, a cap layer 1702 filling a top portion of the opening 1402, a contact etch stop layer (CESL) 1002 on the source/drain regions 902, an interlayer dielectric (ILD) layer 1004 on the source/drain regions 902, contacts 1902 extending through the ILD layer 1004 and the CESL 1002 and on the source/drain regions 902, a spacer 802 adjacent the opening 1402. Referring to FIG. 34, an air gap 1602 includes a first sidewall interfacing the gate structure 1300 and a second sidewall interfacing the source/drain regions 902. In some embodiments, the multiple stacked channel regions 208 include a doped 2D material layer similar or the same as the doped 2D material layer shown and described with reference to FIGS. 29 to 32.

FIGS. 35 to 38 illustrate a carrier (e.g., electrons) concentration across channel regions 240 to 270 of the FinFET devices 24 to 27, respectively, when the FinFET devices 24 to 27 are turned on. The light-shaded areas denote low carrier concentration, and dark-shaded areas denote high carrier concentration. Similarly, FIGS. 39 to 42 illustrate a carrier (e.g., electrons) concentration across channel regions 290 to 320 of the GAA semiconductor devices 29 to 32, respectively, when the semiconductor devices 29 to 32 are turned on. The light-shaded areas denote low carrier concertation, and dark-shaded areas denote high carrier concentration.

FIGS. 43-45 provide exemplary ranges associated with the heights, widths, and thicknesses of exemplary channel structures including doped 2D material layers for a fin-type semiconductor device according to some embodiments.

FIGS. 46-49 provide exemplary ranges associated with the heights, widths, and thicknesses of exemplary channel structures including doped 2D material layers for a gate-around type (GAA) semiconductor device according to some embodiments.

In an embodiment, a semiconductor device includes a substrate, a semiconductor structure on the substrate and comprising a source region, a drain region, and a channel region disposed between the source region and the drain region and including a doped two-dimensional (2D) material layer comprising a first portion on an upper surface of the channel region, an interfacial layer on the first portion of the doped 2D material layer and on sidewalls of the channel region, and a gate electrode on the interfacial layer. In some exemplary embodiments, the doped 2D material layer extends across the channel region. In an embodiment, the doped 2D material layer has a graded doping concentration across its thickness.

In an embodiment, a semiconductor device includes a substrate, a semiconductor structure suspending over the substrate and comprising a source region, a drain region, and a channel region disposed between the source region and the drain region, the channel region includes a doped two-dimensional (2D) material layer comprising a first portion on an upper surface of the channel region. In an embodiment, the semiconductor device further includes an interfacial layer surrounding the channel region including the first portion of the doped 2D material layer, and a gate electrode surrounding the interfacial layer.

In an embodiment, a method of fabricating a semiconductor device includes: providing a substrate having a semiconductor structure formed thereon, forming a doped two-dimension material layer on the semiconductor structure, forming a material semiconductor layer on the doped two-dimension material layer, forming an interfacial layer on the pristine channel material layer, and forming a gate electrode on the interfacial layer. In an embodiment, the semiconductor layer is a pristine channel material layer.

The foregoing merely outlines features of embodiments of the disclosure. Various modifications and alterations to the described embodiments will be apparent to those skilled in the art in view of the teachings herein. Those skilled in the art will appreciate that equivalent constructions do not depart from the scope of the present disclosure, and that they may make various changes, substitutions, and alterations herein without departing from the spirit and scope of the present disclosure.

What is claimed is:

1. A method of manufacturing a semiconductor device, comprising:
   providing a substrate;
   forming a pristine channel layer on the substrate;
   forming a two-dimensional (2D) material layer on the pristine channel layer;
   performing an ion implantation process onto the 2D material layer to produce a doped 2D material layer;

performing a thermal treatment process to bond the doped 2D material layer to the pristine channel layer;

performing an etching process to form a channel structure; and forming an interface layer over the channel structure.

2. The method of claim 1, wherein the substrate comprises an elementary semiconductor.

3. The method of claim 1, wherein the substrate comprises a compound semiconductor.

4. The method of claim 1, wherein the pristine channel layer comprises silicon.

5. The method of claim 1, wherein the pristine channel layer comprises silicon germanium.

6. The method of claim 1, wherein the pristine channel layer is formed by chemical vapor deposition (CVD).

7. The method of claim 1, wherein the 2D material layer comprises graphene.

8. The method of claim 1, wherein the 2D material layer comprises $WS_2$, $WSe_2$, $MoS_2$, and $MoSe_2$.

9. The method of claim 1, wherein the 2D material layer has a thickness in a range between 0.5 nm to 30 nm.

10. The method of claim 1, wherein the 2D material layer has a thickness in a range between 0.5 nm to 10 nm.

11. The method of claim 1, wherein the doped 2D material layer is p-type.

12. The method of claim 1, wherein the doped 2D material layer is n-type.

13. The method of claim 1, wherein the thermal treatment process is performed at a temperature ranging between 400° C. to 1200° C.

14. The method of claim 1, wherein performing the etching process comprises:

forming a patterned mask layer on the doped 2D material layer; and etching the doped 2D material layer and the pristine channel layer.

15. The method of claim 1, wherein the channel structure comprises:

a lower portion comprising a portion of the pristine channel layer; and an upper portion comprising a portion of the doped 2D material layer.

16. The method of claim 1, wherein the channel structure has a height of 40 nm to 80 nm.

17. A method, comprising:

providing a substrate;

forming a pristine channel layer on the substrate;

forming a two-dimensional (2D) material layer on the pristine channel layer;

doping the 2D material layer, using an ion implantation process, to produce a doped 2D material layer;

performing a thermal treatment process to bond the doped 2D material layer to the pristine channel layer;

performing an etching process to form a channel structure; and forming an interface layer over the channel structure.

18. A method of claim 17, wherein the pristine channel layer comprises silicon germanium or silicon.

19. A method, comprising:

providing a substrate;

forming a pristine channel layer on the substrate;

forming a two-dimensional (2D) material layer on the pristine channel layer;

performing an ion implantation process onto the 2D material layer to produce a doped 2D material layer;

thermally bonding, using a thermal treatment process, the doped 2D material layer to the pristine channel layer;

performing an etching process to form a channel structure; and forming an interface layer over the channel structure.

20. A method of claim 19, wherein the pristine channel layer comprises silicon germanium or silicon.

* * * * *